(12) United States Patent
Rupich et al.

(10) Patent No.: US 7,326,434 B2
(45) Date of Patent: Feb. 5, 2008

(54) PRECURSOR SOLUTIONS AND METHODS OF USING SAME

(75) Inventors: Martin W. Rupich, Framingham, MA (US); Thomas A. Kodenkandath, Marlborough, MA (US)

(73) Assignee: American Superconductor Corporation, Westborough, MA (US)

( * ) Notice: Subject to any disclaimer, the term of this patent is extended or adjusted under 35 U.S.C. 154(b) by 0 days.

(21) Appl. No.: 10/673,307

(22) Filed: Sep. 29, 2003

(65) Prior Publication Data

US 2004/0071882 A1    Apr. 15, 2004

Related U.S. Application Data

(60) Division of application No. 09/855,312, filed on May 14, 2001, now abandoned, which is a continuation-in-part of application No. 09/694,400, filed on Oct. 23, 2000, now abandoned.

(51) Int. Cl.
*B05D 5/12* (2006.01)
*B05D 3/02* (2006.01)

(52) U.S. Cl. .......................................... 427/62; 427/226

(58) Field of Classification Search ................ 427/226, 427/62
See application file for complete search history.

(56) References Cited

U.S. PATENT DOCUMENTS

| | | | |
|---|---|---|---|
| 3,763,552 A | 10/1973 | Brown et al. | |
| 3,985,281 A | 10/1976 | Diepers et al. | |
| 4,442,396 A | 4/1984 | Hucker | |
| 4,659,973 A | 4/1987 | Stich | |
| 4,859,652 A | 8/1989 | Block | |
| 4,882,312 A | 11/1989 | Mogro-Campero et al. | |
| 4,956,340 A | 9/1990 | Kimura et al. | |
| 4,959,347 A | 9/1990 | Kobayashi et al. | |
| 4,994,433 A | 2/1991 | Chiang | |
| 4,994,435 A | 2/1991 | Shiga et al. | |
| 5,038,127 A | 8/1991 | Dersch | |
| 5,071,828 A | 12/1991 | Greuter et al. | |
| 5,071,833 A | 12/1991 | Laine et al. | |
| 5,073,537 A | 12/1991 | Hung et al. | |
| 5,229,358 A | 7/1993 | Kumar | |
| 5,231,074 A * | 7/1993 | Cima et al. .................. | 505/434 |
| 5,236,890 A | 8/1993 | Murakami et al. | |
| 5,304,533 A | 4/1994 | Kobayashi et al. | |
| 5,427,055 A | 6/1995 | Ichikawa | |
| 5,449,659 A | 9/1995 | Garrison et al. | |
| 5,484,766 A | 1/1996 | Shah et al. | |
| 5,571,603 A | 11/1996 | Utumi et al. | |
| 5,728,214 A | 3/1998 | Konishi et al. | |
| 5,741,377 A | 4/1998 | Goyal et al. | |
| 5,866,252 A | 2/1999 | de Rochemont et al. | |
| 5,958,599 A | 9/1999 | Goyal et al. | |
| 5,964,966 A | 10/1999 | Goyal et al. | |
| 5,968,877 A | 10/1999 | Budai et al. | |
| 5,981,445 A | 11/1999 | Kirchnerova et al. | |
| 6,022,832 A | 2/2000 | Fritzemeier et al. | |
| 6,027,564 A | 2/2000 | Fritzemeier et al. | |
| 6,077,344 A | 6/2000 | Shoup et al. | |
| 6,172,009 B1 | 1/2001 | Smith et al. | |
| 6,256,521 B1 | 7/2001 | Lee et al. | |
| 6,562,761 B1 * | 5/2003 | Fritzemeier et al. ........ | 505/510 |

FOREIGN PATENT DOCUMENTS

| | | |
|---|---|---|
| EP | 0 277 020 | 8/1988 |
| EP | 0 277 020 A | 8/1988 |
| EP | 0 277 020 A1 | 8/1988 |
| EP | 0 308 869 | 9/1988 |
| EP | 0 301 591 | 2/1989 |
| EP | 0 301 591 A | 2/1989 |
| EP | 0 349 444 | 1/1990 |
| EP | 0 349 444 A | 1/1990 |
| EP | 0 387 525 | 9/1990 |
| EP | 0 431 782 | 6/1991 |
| EP | 0 431 813 | 6/1991 |
| EP | 0 431 813 A | 6/1991 |
| EP | 0 506 582 | 9/1992 |
| EP | 0 584 410 | 3/1994 |
| EP | 0 872 579 | 10/1998 |
| JP | 57075564 | 5/1982 |
| JP | 63310366 | 12/1988 |

(Continued)

OTHER PUBLICATIONS

G. Moore et al., "Sol-Gel Processing of $Y_1Ba_2Cu_3O_{7-x}$ Using Alkoxide Precursors: Two Systems Yielding High Degrees of Thin Film Orientation and Crystal Growth", *Materials Letters*, vol. 7, No. 12, Mar. 1989, pp. 415-424.

(Continued)

*Primary Examiner*—Fred J. Parker
(74) *Attorney, Agent, or Firm*—Occhiuti Rohlicek & Tsao LLP

(57) ABSTRACT

Superconductor precursor solutions are disclosed. The precursor solutions contain, for example, a salt of a rare earth metal, a salt of an alkaline earth metal and a salt of a transition metal. The precursor solutions can optionally include a Lewis base. The precursor solutions can be processed relatively quickly to provide a relatively thick and good quality intermediate of a rare earth metal-alkaline earth metal-transition metal oxide.

48 Claims, 7 Drawing Sheets

FOREIGN PATENT DOCUMENTS

| | | |
|---|---|---|
| JP | 02-263709 | 10/1990 |
| JP | 05-009022 | 1/1993 |
| JP | 05-229822 | 9/1993 |
| WO | WO91/16149 | 10/1991 |
| WO | WO92/05591 | 4/1992 |
| WO | WO94/17078 | 8/1994 |
| WO | WO97/05669 | 2/1997 |
| WO | WO98/58415 | 12/1998 |
| WO | WO99/16941 | 4/1999 |
| WO | WO99/17307 | 4/1999 |
| WO | WO99/25908 | 5/1999 |
| WO | WO99/35083 | 7/1999 |
| WO | WO 01/98076 | 12/2001 |

OTHER PUBLICATIONS

M.W. Rupich et al., "Synthesis of Superconductors from Soluble Metal Oxo Alkoxide Precursors", *J. Mater. Res.*, vol. 8, No. 7, Jul. 1993, pp. 1487-1496.

Apicella, M.L. et al., "The Effects of Surface Contamination on the Biaxially Textured Substrate for YBCO Thick Film Deposition", *International Journal of Modern Physics B*, vol. 13, Nos. 9&10 (1999) 997-1004.

Beach et al., "Sol-Gel Synthesis of Rare Earth Aluminate Films as Buffer Layers for High Tc Superconducting Films", *Mat. Res. Soc. Symp. Proc.*, vol. 495, (1998), p. 263-270.

Boffa V. et al., "Laser-ablation deposition of $CeO_2$ thin films on biaxially textured nickel substrates", *Physica C*, vol. 312, (1999), pp. 202-212.

Gupta et al., "Superconducting oxide films with high transition temperature prepared from metal trifluoroacetate precursors", *320 Applied Physics Letters*, vol. 52, (1988) pp. 2077-2079.

IBM Technical Disclosure Bulletin, "Fabrication of High Temperature Superconducting Films Using Perfluoro-Organometallic Precursors", vol. 32, No. 5B, Oct. 1989, p. 241.

Lee et al., "Alternative Buffer Architectures for High Critical Current Density YBCO Superconducting Deposits on Rolling Assisted Biaxially-Textured Substrates", *Japanese J. Appl. Phys.*, vol. 38, (1999), L178-L180.

McIntyre, Paul C. et al., "Epitaxial nucleation and growth of chemically derived $Ba_2Yc_3O_{7-x}$ thin films on (001) $SrTiO_3$", *Journal of Applied Physics*, 77 (1995), pp. 5263-5272.

McIntyre, Paul C. et al., Effect of growth conditions on the properties and morphology of chemically derived epitaxial thin films of $Ba_2Ycu_3O_{7-x}$ on (001) $LaAlO_3$, *J. Appl. Phys.*, vol. 71, No. 4, Feb. 15, 1992, pp. 1868-1877.

Paranthaman et al., "Growth of Biaxially Textured $RE_2O_3$ Buffer Layers on Rolled-Ni Substrates Using Reactive Evaporation for HTS-Coated Conductors", *Superconductor Sci. Tech.*, vol. 12, (1999), pp. 319-325.

Qing He, D.K. et al., "Growth of Biaxially Oriented Conductive $LaNiO_3$ Buffer Layers on Textured Ni Tapes for High-$T_c$-Coated Conductors", *Physica C 314* (1999) p. 105-111.

Qing He, D.K. et al., "Deposition of biaxially-oriented metal and oxide buffer-layer films on textured Ni tapes: new substrates for high-current, high-temperature superconductors", *Physica C*, vol. 275 (1997) pp. 155-161.

Sheth, Atul et al., "Bench Scale Evaluation of Batch Mode Dip-Coating of Sol-Gel $LaAlO_3$ Buffer Material", *IEEE Transactions on Applied Superconductivity*, vol. 9, No. 2, Jun. 1999, pp. 1514-1518.

Shoup et al., "Epitaxial Thin Film Growth of Lanthanum and Neodymium Aluminate Films on Roll-Textured Nickel Using a Sol-Gel Method", *J. Am. Cer. Soc.*, vol. 81, (1998), pp. 3019-3021.

"Silicon Processing for the VLSI Era", vol. 1, eds. S. Wolf and R.N. Tanber, Lattice Press, Sunset Park, CA, pp. 539-574 (1986).

Smith, J.A. et al., "High Critical Current Density Thick MOD-Derived YBCO Films", *IEEE Transactions on Applied Superconductivity*, vol. 9, No. 2, Jun. 1999, pp. 1531-1534.

G. Risse et al., "Textured YBCO-Film Formation by Sol-Gel Process and Post Annealing," Journal of European Ceramic Society 19 (1999) 125-130.

Office Action received in Korean Application No. 2003-7005637, dated Jul. 29, 2005.

Koster et al., fiInfluence of the Surface Treatment on the Homoepitaxial Growth of $SrTiO_3$, *Materials Science & Engineering B56*, (1998) p. 209-212.

Rupich et al., "Growth and Characterization of Oxide Buffer Layers for YBCO Coated Conductors", *IEEE Trans. on Appl. Superconductivity*, vol. 9, (1999), pp. 1527-1530.

Tanaka et al., "Improvement of $Yba_2Cu_3O_x$ Single-Crystal Surface by Chemical Etching", *Jpn. J. Appl. Phys.*, vol. 38 (1999) p. L731-L733.

Office Action received in European Application No. 01 988 951.8, dated Nov. 22, 2005.

Peizhi, Preparation of $YBa_2Cu_3O_{7-x}$ Superconducting Thin Films by Metalorganic Deposition, Rare Metal Materials and Engineering, vol. 24, No. 6, pp. 58-63, 1995.

\* cited by examiner

PRECURSOR SOLUTIONS AND METHODS OF USING SAME

CROSS-REFERENCE TO RELATED APPLICATION

This application is a divisional of U.S. patent application Ser. No. 09/855,312, filed on May 14, 2001, and entitled, "Precursor Solutions and Methods of Using Same", abandoned, which in turn is a continuation-in-part of U.S. patent application Ser. No. 09/694,400, filed Oct. 23, 2000, and entitled "Precursor Solutions and Methods of Using Same", abandoned. This application claims priority under 35 U.S.C. §120 to both U.S. patent application Ser. No. 09/855,312 and U.S. patent application Ser. No. 09/694,400, and the contents of both these applications are hereby incorporated by reference.

BACKGROUND OF THE INVENTION

The invention relates to precursor solutions and methods of using the precursor solutions.

Multi-layer articles can be used in a variety of applications. For example, superconductors, including oxide superconductors, can be formed of multi-layer articles. Typically, such superconductors include a layer of superconductor material and a layer, commonly referred to as a substrate, that can enhance the mechanical strength of the multi-layer article.

Generally, in addition to enhancing the strength of the multi-layer superconductor, the substrate should exhibit certain other properties. For example, the substrate should have a low Curie temperature so that the substrate is not ferromagnetic at the superconductor's application temperature. Furthermore, chemical species within the substrate should not be able to diffuse into the layer of superconductor material, and the coefficient of thermal expansion of the substrate should be about the same as the superconductor material. Moreover, if the substrate is used for an oxide superconductor, the substrate material should be relatively resistant to oxidation.

For some materials, such as yttrium-barium-copper-oxide (YBCO), the ability of the material to provide high transport current in its superconducting state depends upon the crystallographic orientation of the material. For example, such a material can exhibit a relatively high critical current density (Jc) when the surface of the material is biaxially textured.

As used herein, "biaxially textured" refers to a surface for which the crystal grains are in close alignment with a direction in the plane of the surface. One type of biaxially textured surface is a cube textured surface, in which the crystal grains are also in close alignment with a direction perpendicular to the surface. Examples of cube textured surfaces include the (100)[001] and (100)[011] surfaces, and an example of a biaxially textured surface is the (113)[211] surface.

For certain multi-layer superconductors, the layer of superconductor material is an epitaxial layer. As used herein, "epitaxial layer" refers to a layer of material whose crystallographic orientation is directly related to the crystallographic orientation of the surface of a layer of material onto which the epitaxial layer is deposited. For example, for a multi-layer superconductor having an epitaxial layer of superconductor material deposited onto a substrate, the crystallographic orientation of the layer of superconductor material is directly related to the crystallographic orientation of the substrate. Thus, in addition to the above-discussed properties of a substrate, it can be also desirable for a substrate to have a biaxially textured surface or a cube textured surface.

Some substrates do not readily exhibit all the above-noted features, so one or more intermediate layers, commonly referred to as buffer layers, can be disposed between the substrate and the superconductor layer. The buffer layer(s) can be more resistant to oxidation than the substrate, and reduce the diffusion of chemical species between the substrate and the superconductor layer. Moreover, the buffer layer(s) can have a coefficient of thermal expansion that is well matched with the superconductor material.

Typically, a buffer layer is an epitaxial layer, so its crystallographic orientation is directly related to the crystallographic orientation of the surface onto which the buffer layer is deposited. For example, in a multi-layer superconductor having a substrate, an epitaxial buffer layer and an epitaxial layer of superconductor material, the crystallographic orientation of the surface of the buffer layer is directly related to the crystallographic orientation of the surface of the substrate, and the crystallographic orientation of the layer of superconductor material is directly related to the crystallographic orientation of the surface of the buffer layer. Therefore, the superconducting properties exhibited by a multi-layer superconductor having a buffer layer can depend upon the crystallographic orientation of the buffer layer surface.

Certain superconductor precursor solutions can take a relatively long period of time to form a superconductor intermediate (e.g., a metal oxyhalide intermediate). In some instances, trying to reduce this period of time can result in the intermediate having a density of defects such that further treatment to form a superconductor material results in a layer of superconductor material with a relatively low critical current density.

SUMMARY OF THE INVENTION

The invention relates in part to the realization that during the formation of certain rare earth-alkaline earth-transition metal oxides (e.g,. YBCO compounds such as $YBa_2Cu_3O_{7-x}$) defect formation can be reduced or prevented by selecting a precursor solution containing an appropriate salt of the rare earth metal, an appropriate salt of the alkaline earth metal, an appropriate salt of the transition metal, one or more appropriate solvents, and optionally water. Such precursor solutions can be used to form a relatively high quality (e.g., low defect density), relatively thick (e.g., at least about one micrometer thick) intermediate of the rare earth-alkaline earth-transition metal oxide (e.g., a metal oxyhalide intermediate) in a relatively short period of time (e.g., less than about five hours). The intermediate can then be further processed to form a rare earth-alkaline earth-transition metal oxide (e.g., an YBCO compound, such as $YBa_2Cu_3O_{7-x}$) having a low defect density and/or a relatively critical current density (e.g., at least about $0.5 \times 10^6$ Amperes per square centimeter).

An illustrative and nonlimiting list of solvents includes water, alcohols (e.g., methanol, 2-methoxyethanol, butanol, isopropanol), acetonitrile, tetrahydrofuran, 1-methyl-2-pyrrolidinone and pyridine. Combinations of two or more of these solvents can be used.

The constituents of the precursor solution should be selected so that during processing of the precursor solution to form the intermediate of the rare earth-alkaline earth-transition metal oxide at least one, and preferably substantially all, of the following parameters are met.

One parameter is that minimal alkaline earth carbonate (e.g., $BaCO_3$) formation occurs when processing precursor solution to form the intermediate (e.g., metal oxyhalide). Preferably, the amount of alkaline earth carbonate formed is not detectable by X-ray diffraction. Without wishing to be bound by theory, it is believed that alkaline earth carbonate formation can be undesirable because the alkaline earth carbonate (e.g., $BaCO_3$) can be thermally stable at temperatures above the formation temperature of the formation temperature of the rare earth-alkaline earth-transition metal oxide (e.g., $YBa_2Cu_3O_{7-x}$), thereby reducing the amount of rare earth-alkaline earth-transition metal oxide formed. In certain embodiments, the alkaline earth metal salts contained in the precursor solution are selected so that, rather than forming alkaline earth oxide(s) (e.g., BaO), they preferentially form alkaline earth compounds that undergo little if any conversion to alkaline earth carbonate (e.g., alkaline earth halide(s), such as $BaF_2$, $BaCl_2$, $BaBr_2$ and/or $BaI_2$). The alkaline earth compound (e.g., alkaline earth halide) should also be capable of being converted to appropriate alkaline earth oxide(s) (e.g., BaO) at a later time when the alkaline earth oxide(s) will quickly react with rare earth oxide(s) (e.g., $Y_2O_3$) and transition metal oxide(s) (e.g., CuO) to form the rare earth metal-alkaline earth metal-transition metal oxide (e.g., an YBCO compound, such as ($YBa_2Cu_3O_{7-x}$)).

Another parameter is that minimal defect formation occurs during formation of the rare earth-alkaline earth-transition metal oxide intermediate (e.g., metal oxyhalide intermediate). As used herein, a "defect" refers to a crack or a blister, such as a crack or blister that is detectable by visual (or optical) inspection.

An additional parameter is that is the rare earth metal-alkaline earth metal-transition metal oxide intermediate has no compositional phase segregations of a size that is more than about one tenth the thickness of the intermediate film. Further processing of such an intermediate can result in a rare earth metal-alkaline earth metal-transition metal oxide that is substantially homogeneous (e.g., $YBa_2Cu_3O_{7-x}$ that is substantially 123 phase).

Another parameter is that, during conversion of the precursor to the intermediate (e.g., metal oxyhalide), minimal cross-linking occurs between discrete transition metal molecules (e.g., copper molecules). Without wishing to be bound by theory, it is believed that, when processing the precursor solution to form the intermediate (e.g., metal oxyhalide), some transition metal salts can undergo chemical reactions in which discrete copper molecules become cross-linked. It is believed that such cross-linked molecules have a relatively high susceptibility to defect formation. Without wishing to be bound by theory, it is believed that this cross-linking can occur when water coordinated in the octahedral sites of the transition metal (e.g., copper) is displaced during processing (e.g., at a temperature in the range of from about 200° C. to about 220° C. for some transition metal salts), thereby opening bonding sites on the transition metal atom of one transition metal molecule to interact with atoms (e.g., oxygen or fluorine) of another transition metal molecule. In some embodiments, it is believed that formation of such cross-linked discrete transition metal molecules can be reduced by selecting a transition metal salt (e.g., copper salt) that sterically and/or chemically hinders the cross-linking during processing (e.g., by using relatively large organic groups or relatively large atoms, such as chlorine, bromine or iodine, in the transition metal salt, or by using relatively electropositive atoms, such as hydrogen, in the transition metal salt).

Another parameter is that the rare earth metal salt should be selected such that during processing the salt is converted to rare earth metal oxide(s) (e.g. $Y_2O_3$), as opposed to other compounds.

In one aspect, the invention features a method that includes disposing a precursor solution onto a surface of a layer to form a precursor film. The precursor film includes a salt of a rare earth metal, a salt of an alkaline earth metal and a carboxylate salt of a transition metal (e.g., a propionate salt of a transition metal). For example, the transition metal salt can be $Cu(O_2CC_2H_5)_2$. The method also includes treating the precursor film to form a layer of an intermediate of a rare earth metal-alkaline earth metal-transition metal oxide.

In another aspect, the invention features a method that includes disposing a precursor solution onto a surface of a layer to form a precursor film. The precursor film includes a salt of a rare earth metal, a salt of an alkaline earth metal and a carboxylate salt of copper (e.g., $Cu(O_2CC_2H_5)_2$). The method also includes treating the precursor film to form a layer of an intermediate of a rare earth metal-alkaline earth metal-transition metal oxide.

In a further aspect, the invention features a method that includes disposing a precursor solution onto a surface of a layer to form a precursor film. The precursor film includes a salt of a rare earth metal, a salt of an alkaline earth metal and a carboxylate salt of a transition metal (e.g., a propionate salt of a transition metal). For example, the transition metal salt can be $Cu(O_2CC_2H_5)_2$. The method also includes treating the precursor film to form a layer of an intermediate of a rare earth metal-alkaline earth metal-transition metal oxide.

In general, a precursor film can be formed by disposing a precursor solution onto the surface of a layer of material, with or without further processing (e.g., the precursor film can be formed of the same chemical components as the precursor solution). For example, a precursor film containing a salt of a rare earth metal, a salt of an alkaline earth metal and a salt of a transition metal can be disposed onto the surface of a layer of material by, for example, dip coating, spin coating, slot coating or web coating. In some embodiments, the method of disposing the precursor solution (e.g., spin coating) on the layer of material can convert the precursor solution into a precursor film (e.g., by at least partially removing solvent(s) from the precursor solution) without additional processing.

In another aspect, the invention features a composition that includes a salt of a rare earth metal, a salt of an alkaline earth metal and a carboxylate salt of copper (e.g., $Cu(O_2CC_2H_5)_2$).

In one aspect, the invention features a method that includes disposing a precursor solution onto a surface of a layer to form a precursor film. The precursor film includes a salt of a rare earth metal, a salt of an alkaline earth metal, a salt of a transition metal and a Lewis base. The method also includes treating the precursor film to form an intermediate of a rare earth metal-alkaline earth metal-transition metal oxide.

In another aspect, the invention features a composition that includes a Lewis base, a salt of a rare earth metal, a salt of an alkaline earth metal and a salt of a transition metal.

The superconductor intermediate can be, for example, partially or completely formed of one or more metal oxyhalide compounds.

The invention can be particularly advantageous when preparing a superconductor in the form of an object having a relatively large surface area, such as a tape or a wafer.

In some embodiments, the superconductor material is preferably formed of YBCO (e.g., $YBa_2Cu_3O_{7-x}$).

The superconductor material can have a critical current of at least about 200 Amperes per centimeter of width (e.g., at least about 300 Amperes per centimeter of width, at least about 500 centimeters per centimeter of width).

Unless otherwise defined, all technical and scientific terms used herein have the same meaning as commonly understood by one of ordinary skill in the art to which this invention belongs. Although methods and materials similar or equivalent to those described herein can be used in the practice of the invention, suitable methods and materials are described below. In case of conflict, the present specification, including definitions, will control. In addition, the materials, methods, and examples are illustrative only and not intended to be limiting.

Other features and advantages of the invention will be apparent from the description of the preferred embodiments, the figures and the claims.

DESCRIPTION OF THE PREFERRED EMBODIMENTS

Figure 1:
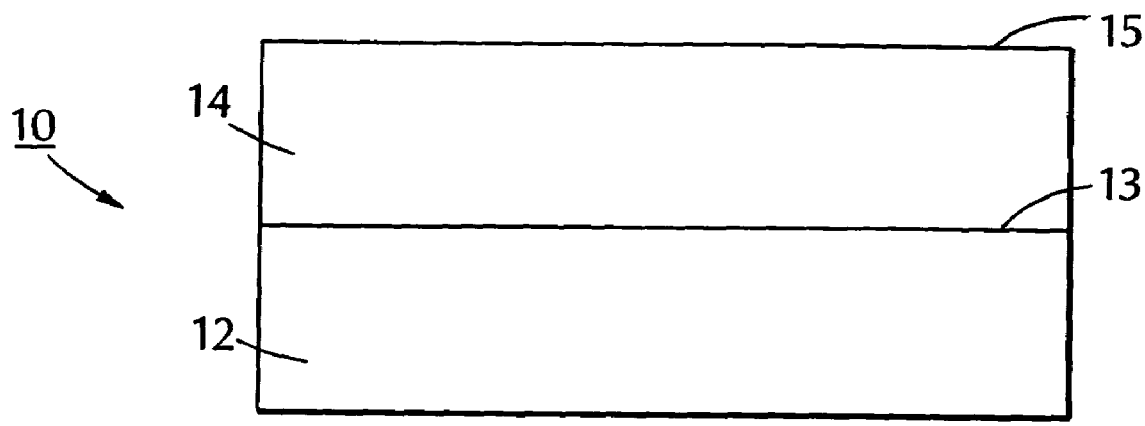
FIG. 1 is a cross-sectional view of one embodiment of a multi-layer article.

The invention relates to precursor solutions and methods of using the precursor solutions.

The precursor solutions contain a salt of a rare earth metal, a salt of an alkaline earth metal, a salt of a transition metal, and one or more solvents. Optionally, the precursor solutions can contain water. In some embodiments, the precursor solutions can contain one or more Lewis bases.

The rare earth metal can be yttrium, lanthanum, europium, gadolinium, terbium, dysprosium, holmium, erbium, thulium, ytterbium, cerium, praseodymium, neodymium, promethium, samarium or lutetium. In general, the rare earth metal salt can be any rare earth metal salt that is soluble in the solvent(s) contained in the precursor solution and that, when being processed to form an intermediate (e.g., a metal oxyhalide intermediate), forms rare earth oxide(s) (e.g., $Y_2O_3$). Such salts can have, for example, the formula $M(O_2C-(CH_2)_n-CXX'X'')(O_2C-(CH_2)_m-CX'''X''''X''''')(O_2C-(CH_2)_p-CX''''''X'''''''X'''''''')$ or $M(OR)_3$. M is the rare earth metal. n, m and p are each at least one but less than a number that renders the salt insoluble in the solvent(s) (e.g., from one to ten). Each of X, X', X'', X''', X'''', X''''', X'''''', and X''''''' is H, F, Cl, Br or I. R is a carbon containing group, which can be halogenated (e.g., $CH_2CF_3$) or nonhalogenated. Examples of such salts include nonhalogenated carboxylates, halogenated acetates (e.g., trifluoroacetate, trichloroacetate, tribromoacetate, triiodoacetate), halogenated alkoxides, and nonhalogenated alkoxides. Examples of such nonhalogenated carboxylates include nonhalogenated actetates (e.g., $M(O_2C-CH_3)_3$).

Typically, the alkaline earth metal is barium, strontium or calcium. Generally, the alkaline earth metal salt can be any alkaline earth metal salt that is soluble in the solvent(s) contained in the precursor solution and that, when being processed to form an intermediate (e.g., a metal oxyhalide intermediate), forms an alkaline earth halide compound (e.g., $BaF_2$, $BaCl_2$, $BaBr_2$, $BaI_2$) prior to forming alkaline earth oxide(s) (e.g, BaO). Such salts can have, for example, the formula $M'(O_2C-(CH_2)_n-CXX'X'')(O_2C-(CH_2)_m-CX'''X''''X''''')$ or $M'(OR)_2$. M' is the alkaline earth metal. n and m are each at least one but less than a number that renders the salt insoluble in the solvent(s) (e.g., from one to ten). Each of X, X', X'', X''', X'''' and X''''' is H, F, Cl, B or, I. R can be a halogenated or nonhalogenated carbon containing group. Examples of such salts include halogenated acetates (e.g., trifluoroacetate, trichloroacetate, tribromoacetate, triiodoacetate).

Generally, the transition metal is copper. The transition metal salt should be soluble in the solvent(s) contained in the precursor solution. Preferably, during conversion of the precursor to the intermediate (e.g., metal oxyhalide), minimal cross-linking occurs between discrete transition metal molecules (e.g., copper molecules). Such transition metals salts can have, for example, the formula $M''(CXX'X''-CO(CH)_aCO-CX'''X''''X''''')(CX''''''X'''''''X''''''''-CO(CH)_bCO\ CX'''''''''X''''''''''X'''''''''')$, $M''(O_2C-(CH_2)_n-CXX'X'')(O_2C-(CH_2)_m-CX'''X''''X''''')$ or $M''(OR)_2$. M'' is the transition metal. a and b are each at least one but less than a number that renders the salt insoluble in the solvent(s) (e.g., from one to five). Generally, n and m are each at least one but less than a number that renders the salt insoluble in the solvent(s) (e.g., from one to ten). Each of X, X', X'', X''', X'''', X''''', X'''''', X''''''', X'''''''', X''''''''', X'''''''''', X''''''''''', is H, F, Cl, Br or I. R is a carbon containing group, which can be halogenated (e.g., $CH_2CF_3$) or nonhalogenated. These salts include, for example, nonhalogenated actetates (e.g., $M''(O_2C-CH_3)_2$), halogenated acetates, halogenated alkoxides, and nonhalogenated alkoxides. Examples of such salts include copper trichloroacetate, copper tribromoacetate, copper triiodoacetate, $Cu(CH_3COCHCOCF_3)_2$, $Cu(OOCC_7H_{15})_2$, $Cu(CF_3COCHCOF_3)_2$, $Cu(CH_3COCHCOCH_3)_2$, $Cu(CH_3CH_2CO_2CHCOCH_3)_2$, $CuO(C_5H_6N)_2$ and $Cu_3O_3Ba_2(O-CH_2CF_3)_4$. In certain embodiments, the transition metal salt is a carboxylate salt (e.g., a nonhalogenated carboxylate salt), such as a propionate salt of the transition metal (e.g., a nonhalogenated propionate salt of the transition metal). An example of a nonhalogenated propionate salt of a transition metal is $Cu(O_2CC_2H_5)_2$. In some embodiments, the transition metal salt is a simple salt, such as copper sulfate, copper nitrate, copper iodide and/or copper oxylate. In some embodiments, n and/or m can have the value zero. In certain embodiments, a and/or b can have the value zero.

An illustrative and nonlimiting list of Lewis bases includes nitrogen-containing compounds, such as ammonia and amines. Examples of amines include $CH_3CN$, $C_5H_5N$ and $R_1R_2R_3N$. Each of $R_1$, $R_2$, $R_3$ are independently H, an alkyl group (e.g., a straight chained alkyl group, a branched alkyl group, an aliphatic alkyl group, a non-aliphatic alkyl group and/or a substituted alkyl group) or the like. Without wishing to be bound by theory, it is believed that the presence of a Lewis base in the precursor solution can reduce cross-linking of copper during intermediate formation. It is believed that this is achieved because a Lewis base can coordinate (e.g., selective coordinate) with copper ions, thereby reducing the ability of copper to cross-link.

In certain embodiments, the precursor solutions can have a relatively low total free acid concentration. In some embodiments, the precursor solutions have a total free acid concentration of less than about $1 \times 10^{-3}$ molar (e.g., less than about $1 \times 10^{-5}$ molar, about $1 \times 10^{-7}$ molar). Examples of free acids that can be contained in the precursor solutions include trifluoroacetic acid, acetic acid, nitric acid, sulfuric acids, acids of iodides, acids of bromides and acids of sulfates.

In some embodiments, such as when the precursor solutions contain water, the precursor solutions can have a relatively neutral pH. For example, the pH of the precursor solutions can be at least about 3 (e.g., at least about 5, about 7).

The precursor solutions can have a relatively low water content. In certain embodiments, the precursor solutions have a water content of less than 50 volume percent, more (e.g., less than about 35 volume percent, less than 25 volume percent).

The amount of the transition metal, alkaline earth metal and rare earth metal can be selected so that the ratio of the molar amount of each of these elements (e.g, in the ionic state) in the precursor solution is about 3:2:1.

In certain embodiments, the alkaline earth metal salt (e.g., barium salt) is the predominant (e.g., exclusive) source of the halogen used to form the alkaline earth metal halide when processing the precursor solution to form the intermediate (e.g., the metal oxyhalide intermediate). In other embodiments, such as when the rare earth metal salt undergoes decomposition at the same time as the alkaline earth metal salt, the rare earth salt can also supply halogen to the alkaline earth metal. In some embodiments, such as when the transition metal salt undergoes decomposition at the same time as the alkaline earth metal salt, the transition metal salt can also supply halogen to the alkaline earth metal. In certain embodiments, when both the rare earth metal salt and the transition metal salt undergo decomposition at the same time as the alkaline earth metal salt, the rare earth metal salt and the transition metal can supply halogen to the alkaline earth metal.

In general, the precursor solutions can be prepared by combining the salts of the rare earth metal, the transition metal and the alkaline earth metal with the desired solvent(s) and optionally water and/or one or more Lewis bases. In certain embodiments, the salts are combined so that the mole ratio of the transition metal salt:alkaline earth metal salt:rare earth metal salt in the precursor solution is about 3:2:1.

Subsequent to formation of the precursor solution, the solution can be disposed on the surface of an underlying layer (e.g., buffer layer, superconductor layer or substrate). Generally, the particular solvent(s) used, as well as the amount of the solvent(s) and/or water contained in the precursor solutions can be selected based upon the technique that will be used to dispose the precursor solution on the surface of the underlying layer. For example, if the solution will be dip coated, spin coated or web coated onto the surface of the underlying material layer, one or more alcohols (e.g., methanol, 2-methoxyethanol, butanol and/or isopropanol) can be used, and the amount of solvent(s) can be selected so that the desired viscosity and solids content is achieved. In embodiments in which the precursor solution is to be web coated on the underlying layer, it may be desirable for the precursor solution to have a kinematic viscosity of from about one centiStoke to about 10 centiStokes.

Subsequent to being disposed on the surface of the underlying layer, the solution is treated to form a layer of superconductor material. This treatment generally involves heating at appropriate rates and in an appropriate gas environment so that during conversion of the precursor solution to the intermediate (e.g., a metal oxyhalide intermediate), minimal alkaline earth carbonate (e.g., $BaCO_3$) forms and minimal cross-linking occurs between discrete transition metal molecules (e.g., copper molecules). The intermediate (e.g., metal oxyhalide intermediate) is then further heated to form the desired superconductor material. Certain methods of forming the intermediate and the superconductor material are described below.

FIG. 1 shows a multi-layer superconductor 10 according to one embodiment of the invention and prepared using the above-described methods. Article 10 includes a substrate layer 12 with a surface 13 and a superconductor material layer 14 with a surface 15. Layer 14 is disposed on surface 13.

Layer 12 can be formed of any material capable of supporting layer 14. In embodiments in which article 10 is a multi-layer superconductor, layer 12 can be formed of a substrate material. Examples of substrate materials that can be used as layer 12 include for example, metals and/or alloys, such as nickel, silver, copper, zinc, aluminum, iron, chromium, vanadium, palladium, molybdenum and/or their alloys.

Surface 13 of layer 12 can also be prepared using vacuum processes, such as ion beam assisted deposition, inclined substrate deposition and other vacuum techniques known in the art to form a biaxially textured surface on, for example, a randomly oriented polycrystalline surface.

In some embodiments, a buffer layer can be formed using ion beam assisted deposition (IBAD). In this technique, a buffer layer material is evaporated using, for example, electron beam evaporation, sputtering deposition, or pulsed laser deposition while an ion beam (e.g., an argon ion beam) is directed at a smooth amorphous surface of a substrate onto which the evaporated buffer layer material is deposited.

For example, the buffer layer can be formed by ion beam assisted deposition by evaporating a buffer layer material having a rock-salt like structure (e.g., a material having a rock salt structure, such as an oxide, including MgO, or a nitride) onto a smooth, amorphous surface (e.g., a surface having a root mean square roughness of less than about 100 Angstroms) of a substrate so that the buffer layer material has a surface with substantial alignment (e.g., about 13° or less), both in-plane and out-of-plane.

The conditions used during deposition of the buffer layer material can include, for example, a substrate temperature of from about 0° C. to about 400° C. (e.g., from about room temperature to about 400° C.), a deposition rate of from about 1.0 Angstrom per second to about 4.4 Angstroms per second, an ion energy of from about 200 eV to about 1200 eV, and/or an ion flux of from about 110 microamperes per square centimeter to about 120 microamperes per square centimeter.

In some embodiments, when using IBAD, the substrate is formed of a material having a polycrystalline, non-amorphous base structure (e.g., a metal alloy, such as a nickel alloy) with a smooth amorphous surface formed of a different material (e.g., $Si_3N_4$).

In certain embodiments, a plurality of buffer layers can be deposited by epitaxial growth on an original IBAD surface. Each buffer layer can have substantial alignment (e.g., about 13° or less), both in-plane and out-of-plane.

These methods are described in PCT Publication No. WO 99/25908, published on May 27, 1999, and entitled "Thin Films Having A Rock-Salt-Like Structure Deposited on Amorphous Surfaces," which is hereby incorporated by reference.

In other embodiments, the substrate can be formed of alloys having one or more surfaces that are biaxially textured (e.g., (113)[211]) or cube textured (e.g., (100)[001] or (100)[011]). The alloys can have a relatively low Curie temperature (e.g., at most about 80K, at most about 40K, or at most about 20K).

In some of these embodiments, the substrate is a binary alloy that contains two of the following metals: copper, nickel, chromium, vanadium, aluminum, silver, iron, palladium, molybdenum, gold and zinc. For example, a binary alloy can be formed of nickel and chromium (e.g., nickel and at most 20 atomic percent chromium, nickel and from about five to about 18 atomic percent chromium, or nickel and from about 10 to about 15 atomic percent chromium). As another example, a binary alloy can be formed of nickel and copper (e.g., copper and from about five to about 45 atomic percent nickel, copper and from about 10 to about 40 atomic percent nickel, or copper and from about 25 to about 35 atomic percent nickel). A binary alloy can further include relatively small amounts of impurities (e.g., less than about 0.1 atomic percent of impurities, less than about 0.01 atomic percent of impurities, or less than about 0.005 atomic percent of impurities).

In certain of these embodiments, the substrate contains more than two metals (e.g., a ternary alloy or a quarternary alloy). In these embodiments the alloy can contain one or more oxide formers (e.g., Mg, Al, Ti, Cr, Ga, Ge, Zr, Hf, Y, Si, Pr, Eu, Gd, Tb, Dy, Ho, Lu, Th, Er, Tm, Be, Ce, Nd, Sm, Yb and/or La, with Al being the preferred oxide former), as well as two of the following metals: copper, nickel, chromium, vanadium, aluminum, silver, iron, palladium, molybdenum, gold and zinc. The alloys can contain at least about 0.5 atomic percent oxide former (e.g., at least about one atomic percent oxide former, or at least about two atomic percent oxide former) and at most about 25 atomic percent oxide former (e.g., at most about 10 atomic percent oxide former, or at most about four atomic percent oxide former). For example, the alloy can include an oxide former (e.g., at least about 0.5 aluminum), from about 25 atomic percent to about 55 atomic percent nickel (e.g., from about 35 atomic percent to about 55 atomic percent nickel, or from about 40 atomic percent to about 55 atomic percent nickel) with the balance being copper. As another example, the alloy can include an oxide former (e.g., at least about 0.5 atomic aluminum), from about five atomic percent to about 20 atomic percent chromium (e.g., from about 10 atomic percent to about 18 atomic percent chromium, or from about 10 atomic percent to about 15 atomic percent chromium) with the balance being nickel. The alloys can include relatively small amounts of additional metals (e.g., less than about 0.1 atomic percent of additional metals, less than about 0.01 atomic percent of additional metals, or less than about 0.005 atomic percent of additional metals).

A substrate formed of an alloy can be produced by, for example, combining the constituents in powder form, melting and cooling or, for example, by diffusing the powder constituents together in solid state. The alloy can then be formed by deformation texturing (e.g, annealing and rolling, swaging, extrusion and/or drawing) to form a textured surface (e.g., biaxially textured or cube textured). Alternatively, the alloy constituents can be stacked in a jelly roll configuration, and then deformation textured. In some embodiments, a material with a relatively low coefficient of thermal expansion (e.g, Nb, Mo, Ta, V, Cr, Zr, Pd, Sb, NbTi, an intermetallic such as NiAl or $Ni_3Al$, or mixtures thereof) can be formed into a rod and embedded into the alloy prior to deformation texturing.

These methods are described PCT Publication No. WO 00/58530, published on Oct. 5, 2000, entitled "Alloy Materials;" PCT Publication No. WO 00/58044, published on Oct. 5, 2000, entitled "Alloy Materials;" PCT Publication No. WO 99/17307, published on Apr. 8, 1999, and entitled "Substrates with Improved Oxidation Resistance;" and PCT Publication No. WO 99/16941, published on Apr. 8, 1999, and entitled "Substrates for Superconductors," all of which are hereby incorporated by reference.

In some embodiments, stable oxide formation can be mitigated until a first epitaxial (for example, buffer) layer is formed on the biaxially textured alloy surface, using an intermediate layer disposed on the surface of the substrate. Intermediate layers suitable for use in the present invention include those epitaxial metal or alloy layers that do not form surface oxides when exposed to conditions as established by $P_{O2}$ and temperature required for the initial growth of epitaxial buffer layer films. In addition, the buffer layer acts as a barrier to prevent substrate element(s) from migrating to the surface of the intermediate layer and forming oxides during the initial growth of the epitaxial layer. Absent such an intermediate layer, one or more elements in the substrate would be expected to form thermodynamically stable oxide(s) at the substrate surface which could significantly impede the deposition of epitaxial layers due to, for example, lack of texture in this oxide layer.

In some of these embodiments, the intermediate layer is transient in nature. "Transient," as used herein, refers to an intermediate layer that is wholly or partly incorporated into or with the biaxially textured substrate following the initial nucleation and growth of the epitaxial film. Even under these circumstances, the intermediate layer and biaxially textured substrate remain distinct until the epitaxial nature of the deposited film has been established. The use of transient intermediate layers may be preferred when the intermediate layer possesses some undesirable property, for example, the intermediate layer is magnetic, such as nickel.

Exemplary intermediate metal layers include nickel, gold, silver, palladium, and alloys thereof. Additional metals or alloys may include alloys of nickel and/or copper. Epitaxial films or layers deposited on an intermediate layer can include metal oxides, chalcogenides, halides, and nitrides. In some embodiments, the intermediate metal layer does not oxidize under epitaxial film deposition conditions.

Care should be taken that the deposited intermediate layer is not completely incorporated into or does not completely diffuse into the substrate before nucleation and growth of the initial buffer layer structure causes the epitaxial layer to be established. This means that after selecting the metal (or alloy) for proper attributes such as diffusion constant in the substrate alloy, thermodynamic stability against oxidation under practical epitaxial buffer layer growth conditions and lattice matching with the epitaxial layer, the thickness of the deposited metal layer has to be adapted to the epitaxial layer deposition conditions, in particular to temperature.

Deposition of the intermediate metal layer can be done in a vacuum process such as evaporation or sputtering, or by electro-chemical means such as electroplating (with or without electrodes). These deposited intermediate metal layers may or may not be epitaxial after deposition (depending on substrate temperature during deposition), but epitaxial orientation can subsequently be obtained during a post-deposition heat treatment.

In certain embodiments, substrate 12 can be in the form of an object having a relatively large surface area (e.g., a tape or a wafer). In these embodiments, substrate 12 is preferably formed of a relatively flexible material (e.g., deformation textured nickel or a deformation textured nickel alloy).

Preferably, surface 13 of layer 12 has a relatively well defined crystallographic orientation. For example, surface 13 can be a biaxially textured surface (e.g., a (113)[211] surface) or a cube textured surface (e.g., a (100)[011] surface or a (100)[001] surface). Preferably, the peaks in an X-ray diffraction pole figure of surface 13 have a FWHM of less than about 20° (e.g., less than about 15°, less than about 10°, or from about 5° to about 10°)

Layer 14 can be prepared using one or more of a variety of techniques.

Generally, layer 14 is prepared using the above-described superconductor precursor solution. The precursor solution is applied to a surface (e.g., a buffer layer surface), such as by spin coating or other techniques known to those skilled in the art, and subsequently heated. The precursor is first converted to a superconductor intermediate (e.g., a metal oxyhalide intermediate) in a relatively short period of time (e.g,. less than about five hours, less than about two hours, less than about an hour, less than about 30 minutes, less than about 10 minutes). The superconductor intermediate can be relatively thick (e.g., more than about one micrometer thick, more than about two micrometers thick, more than about three micrometers thick, more than about four micrometers thick, more than about five micrometers thick, more than about six micrometers thick, more than about seven micrometers thick, more than about eight micrometers thick, more than about nine micrometers thick, more than about 10 micrometers thick). The superconductor intermediate can have a relatively low defect density. For example, the superconductor intermediate can be substantially free of any defect having a maximum dimension greater than about 200 micrometers and the defects can form less than about 20 percent of any volume element of the superconductor intermediate defined by a projection of one square centimeter of the surface of the superconductor intermediate (e.g., less than about 10 percent of any volume element of the precursor intermediate defined by a projection of one square centimeter of the surface of the superconductor intermediate, less than about five percent of any volume element of the composition defined by a projection of one square centimeter of the surface of the superconductor intermediate).

A volume element of a layer of material defined by the projection of a given area of a surface of the layer of material corresponds to the volume of the layer of material whose edges are perpendicular to the given area of the surface of the layer of material.

The precursors can be processed using a variety of reaction conditions, including gas environment and tempera-ture. Generally, the conditions selected are such that the precursor solution is converted in a relatively short period of time (e.g, less than about five hours, less than about three hours, less than about two hours, less than about one hour, less than about 30 minutes, less than about 10 minutes) to an intermediate (e.g., a metal oxyhalide intermediate) having a low defect density.

In certain embodiments, when forming an intermediate film (e.g., metal oxyhalide film) having a thickness of at least about one micrometer (e.g., at least about two micrometers, at least about three micrometers, at least about four micrometers, at least about five micrometers, at least about six micrometers, at least about seven micrometers, at least about eight micrometers, at least about nine micrometers, at least about 10 micrometers), the temperature can be ramped from about 200° C. to about 220° C. at a rate of at least about 0.5° C. per minute (e.g., at least about 1° C. per minute, at least about 2° C. per minute, at least about 5° C. per minute, at least about 10° C. per minute, at least about 15° C. per minute, at least about 20° C. per minute).

In some embodiments, the precursor solution can be converted to an intermediate (e.g., a metal oxyhalide intermediate) having a thickness of at least about one micrometer (e.g., at least about two micrometers, at least about three micrometers, at least about four micrometers, at least about five micrometers, at least about six micrometers, at least about seven micrometers, at least about eight micrometers, at least about nine micrometers, at least about 10 micrometers) in less than about five hours (e.g., in less than about two hours, in less than about one hour, in less than about 30 minutes, in less than about 10 minutes). Defects contained within the film of the intermediate can form less than about 20 percent (e.g., less than about 10 percent, less than about five percent, less than about one percent) of any volume element of the intermediate defined by a projection of one square centimeter of the surface of the intermediate, and the intermediate is free of any defect having a maximum dimension greater than about 200 micrometers (e.g., free of any defect having a maximum dimension greater than about 100 micrometers, free of any defect having a maximum dimension greater than about 50 micrometers).

In some embodiments, when forming an intermediate film (e.g., metal oxyhalide film) having a thickness less than about one micrometer, the temperature can be ramped from about 200° C. to about 220° C. at a rate of at least about 1° C. per minute (e.g., at least about 5° C. per minute, at least about 10° C. per minute, at least about 15° C. per minute, at least about 20° C. per minute).

In some embodiments, the precursor solution can be converted to an intermediate (e.g., a metal oxyhalide intermediate) having a thickness of less than about one micrometer in less than about five hours (e.g., in less than about two hours, in less than about one hour, in less than about 30 minutes, in less than about 10 minutes). Defects contained within the film of the intermediate can form less than about 20 percent (e.g., less than about 10 percent, less than about five percent, less than about one percent) of any volume element of the intermediate defined by a projection of one square centimeter of the surface of the intermediate, and the intermediate is free of any defect having a maximum dimension greater than about 200 micrometers (e.g., free of any defect having a maximum dimension greater than about 100 micrometers, free of any defect having a maximum dimension greater than about 50 micrometers).

In some embodiments, the precursor solution can be placed in a pre-heated furnace at an appropriate temperature (e.g., at least about 300° C., from about 300° C. to about 400° C., about 350° C.) for an appropriate period of time (e.g., from about 10 minutes to about five hours, from about 10 minutes to about two hours, from about 10 minutes to about one hour, about 30 minutes) to form an intermediate (e.g., a metal oxyhalide intermediate). The intermediate can be relatively thick (e.g., at least about one micrometer, at least about two micrometers, at least about three micrometers, at least about four micrometers, at least about five micrometers, at least about six micrometers, at least about seven micrometers, at least about eight micrometers, at least about nine micrometers, at least about 10 micrometers). The intermediate can have a relatively low defect density. For example, defects contained within the film of the intermediate can form less than about 20 percent (e.g., less than about 10 percent, less than about five percent, less than about one percent) of any volume element of the intermediate defined by a projection of one square centimeter of the surface of the intermediate, and the intermediate is free of any defect having a maximum dimension greater than about 200 micrometers (e.g., free of any defect having a maximum dimension greater than about 100 micrometers, free of any defect having a maximum dimension greater than about 50 micrometers).

Generally, these methods are performed in a gas environment containing sufficient oxygen so that organic molecules formed are removed in the form of oxidized hydrocarbons. In some embodiments, the gas environment used while heating the precursor solution can be in accordance with the following.

In certain of these embodiments, the solution is first heated in moist oxygen (e.g., having a dew point in the range of from about 20° C. to about 75° C.) to a temperature in the range of from about 300° C. to about 500° C. The coating is then heated for about one hour to a temperature of less than about 860° C. (e.g., less than about 810° C.) in a moist nitrogen-oxygen gas mixture (e.g., having a composition including from about 0.5% to about 5% oxygen). Optionally, the coating can be further heated to a temperature of from about 860° C. to about 950° C. for from about five to about 25 minutes. The coating is subsequently heated to a temperature of from about 400° C. to about 500° C. for at least about eight hours at in dry oxygen. The coating can then be cooled to room temperature in dry oxygen. These methods are described in U.S. Pat. No. 5,231,074, issued on Jul. 27, 1993, and entitled "Preparation of Highly Textured Oxide Superconducting Films from MOD Precursor Solutions," which is hereby incorporated by reference.

In alternate embodiments, the precursor solution is heated from an initial temperature (e.g., room temperature) to a temperature of from about 190° C. to about 215° C. (e.g., about 210° C.) in a water vapor pressure of from about 5 Torr to about 50 Torr water vapor (e.g., from about 5 Torr to about 30 Torr water vapor, or from about 10 Torr to about 25 Torr water vapor). The nominal partial pressure of oxygen can be, for example, from about 0.1 Torr to about 760 Torr. In these embodiments, heating is then continued to a temperature of from about 220° C. to about 290° C. (e.g., about 220° C.) in a water vapor pressure of from about 5 Torr to about 50 Torr water vapor (e.g., from about 5 Torr to about 30 Torr water vapor, or from about 10 Torr to about 25 Torr water vapor). The nominal partial pressure of oxygen can be, for example, from about 0.1 Torr to about 760 Torr. This is followed by heating to about 400° C. at a rate of at least about 2° C. per minute (e.g., at least about 3° C. per minute, or at least about 5° C. per minute) in a water vapor pressure of from about 5 Torr to about 50 Torr water vapor (e.g., from about 5 Torr to about 30 Torr water vapor, or from about 10 Torr to about 25 Torr water vapor) to form an intermediate of the superconductor material (e.g., a metal oxyfluoride intermediate). The nominal partial pressure of oxygen can be, for example, from about 0.1 Torr to about 760 Torr. These methods are described in commonly owned U.S. Provisional Patent Application Ser. No. 60/166,145, filed on Nov. 18, 1999, and entitled "Methods and Compositions for Making a Multi-Layer Article," and commonly owned U.S. patent application Ser. No. 09/615,991, filed Jul. 14, 2000, and entitled "Methods and Compositions for Making a Multi-layer Article," both of which are hereby incorporated by reference.

In other embodiments, heating the precursor solution includes one or more steps in which the temperature is held substantially constant (e.g., constant within about 10° C., within about 5° C., within about 2° C., within about 1° C.) for a relatively long period of time (e.g., more than about one minute, more than about five minutes, more than about 30 minutes, more than about an hour, more than about two hours, more than about four hours) after a first temperature ramp to a temperature greater than about room temperature. In these embodiments, heating the precursor solution can involve using more than one gas environment (e.g., a gas environment having a relatively high water vapor pressure and a gas environment having a relatively low water vapor pressure) while maintaining the temperature substantially constant (e.g., constant within about 10° C., within about 5° C., within about 2° C., within about 1° C.) for a relatively long period of time (e.g., more than about one minute, more than about five minutes, more than about 30 minutes, more than about an hour, more than about two hours, more than about four hours). As an example, in a high water vapor pressure environment, the water vapor pressure can be from about 5 Torr to about 40 Torr (e.g., from about 25 Torr to about 38 Torr, such as about 32 Torr). A low water vapor pressure environment can have a water vapor pressure of less than about 1 Torr (e.g., less than about 0.1 Torr, less than about 10 milliTorr, about five milliTorr). These methods are described in commonly owned U.S. patent application Ser. No. 09/618,811, filed Jul. 14, 2000, and entitled "Methods of Making A Superconductor," which is hereby incorporated by reference.

In certain embodiments, heating the precursor solution can include putting the coated sample in a pre-heated furnace (e.g., at a temperature of at least about 100° C., at least about 150° C., at least about 200° C., at most about 300° C., at most about 250° C., about 200° C.). The gas environment in the furnace can have, for example, a total gas pressure of about 760 Torr, a predetermined partial pressure of water vapor (e.g. at least about 10 Torr, at least about 15 Torr, at most about 25 Torr, at most about 20 Torr, about 17 Torr) with the balance being molecular oxygen. After the coated sample reaches the furnace temperature, the furnace temperature can be increased (e.g., to at least about 225° C., to at least about 240° C., to at most about 275° C., to at most about 260° C., about 250° C.) at a predetermined temperature ramp rate (e.g., at least about 0.5° C. per minute, at least about 0.75° C. per minute, at most about 2° C. per minute, at most about 1.5° C. per minute, about 1° C. per minute). This step can be performed with the same nominal gas environment used in the first heating step. The temperature of the furnace can then be further increased (e.g., to at least about 350° C., to at least about 375° C., to at most about 450° C., to at most about 425° C., about 450° C.) at a predetermined temperature ramp rate (e.g., at least about 5° C. per minute, at least about 8° C. per minute, at most about 20° C. per minute, at most about 12° C. per minute, about 10° C. per minute). This step can be performed with the same nominal gas environment used in the first heating step.

In some embodiments, preparation of a superconductor material can involve slot coating the precursor solution (e.g., onto a tape, such as a tape formed of a textured nickel tape having sequentially disposed thereon epitaxial buffer and/or cap layers, such as $Gd_2O_3$, YSZ and $CeO_2$). The coated precursor film can deposited in an atmosphere containing $H_2O$ (e.g., from about 5 torr $H_2O$ to about 15 torr $H_2O$, from about 9 torr $H_2O$ to about 13 torr $H_2O$, about 11 torr $H_2O$) The balance of the atmosphere can be an inert gas (e.g., nitrogen). The total pressure during film deposition can be, for example, about 760 torr. The precursor film can be decomposed, for example, by transporting the coated tape through a tube furnace (e.g., a tube furnace having a diameter of about 2.5 inches) having a temperature gradient. The respective temperatures and gas atmospheres of the gradients in the furnace, as well as the transport rate of the sample through each gradient, can be selected so that the processing of the film is substantially the same as according to the above-noted methods.

The foregoing treatments of a precursor solution can result in a metal oxyhalide intermediate. Preferably, the metal oxyhalide intermediate has a relatively low defect density. The metal oxyhalide intermediate can be further heated to form the desired superconductor layer. Typically, this step is performed by heating to a temperature of from about 700° C. to about 825° C. During this step, the nominal gas environment typically can contain from about 0.1 Torr to about 50 Torr oxygen and from about 0.1 Torr to about 150 Torr (e.g., about 12 Torr) of water vapor with the balance being nitrogen and/or argon.

Alternatively, the intermediate is then heated for about one hour to a temperature of less than about 860° C. (e.g., less than about 810° C.) in a moist reducing nitrogen-oxygen gas mixture (e.g., having a composition including from about 0.5% to about 5% oxygen). Optionally, the coating can be further heated to a temperature of from about 860° C. to about 950° C. for from about five to about 25 minutes. The coating is subsequently heated to a temperature of from about 400° C. to about 500° C. for at least about eight hours in dry oxygen. The coating can then be cooled to room temperature in static dry oxygen. This approach is described in U.S. Pat. No. 5,231,074.

In other embodiments, the metal oxyhalide is converted into an oxide superconductor at a rate of conversion selected by adjusting temperature, vapor pressure of gaseous water or both. For example, the metal oxyhalide can be converted in a processing gas having a moisture content of less than 100% relative humidity (e.g., less than about 95% relative humidity, less than about 50% relative humidity, or less than about 3% relative humidity) at 25° C. to form some oxide superconductor, then completing the conversion using a processing gas having a higher moisture content (e.g., from about 95% relative humidity to about 100% relative humidity at 25° C.). The temperature for converting the metal oxyhalide can be in the range of from about 700° C. to about 900° C. (e.g., from about 700° C. to about 835° C.). The processing gas can contain from about 1 volume percent oxygen gas to about 10 volume percent oxygen gas.

These methods are described in PCT Publication No. WO 98/58415, published on Dec. 23, 1998, and entitled "Controlled Conversion of Metal Oxyfluorides into Superconducting Oxides," which is hereby incorporated by reference.

In particular embodiments, methods of treating the solution can be employed to minimize the formation of undesirable a-axis oriented oxide layer grains, by inhibiting the formation of the oxide layer until the required reaction conditions are attained.

Conventional processes developed for decomposition and reaction of fluoride-containing precursors use a constant, and low, non-turbulent flow of process gas that is introduced into the decomposition furnace in an orientation that is parallel to the film surface, resulting in a stable boundary layer at the film/gas interface. In the apparatus types typically used for oxide layer precursor decomposition and reaction, the diffusion of gaseous reactants and products through this gas/film boundary layer appears to control the overall reaction rates. In thin, small area films (for example, less than about 0.4 micrometers thick and less than about a square centimeter), the diffusion of $H_2O$ into the film and the diffusion of HF out of the film occur at rates such that the formation of the $YBa_2Cu_3O_{7-x}$ phase does not begin at any significant rate until the sample reaches the processing temperature. However, as the film thickness or area increases, the rates of gaseous diffusion into and out of the film decrease, all other parameters being equal. This results in longer reaction times and/or incomplete formation of the $YBa_2Cu_3O_{7-x}$ phase, resulting in reduced crystallographic texture, lower density, and reduced critical current density. Thus, the overall rate of $YBa_2Cu_3O_{7-x}$ phase formation is determined, to a significant extent, by the diffusion of gases through the boundary layer at the film surface.

One approach to eliminating these boundary layers is to produce a turbulent flow at the film surface. Under such conditions, the local gas composition at the interface is maintained essentially the same as in the bulk gas (that is, the $pH_2O$ is constant, and the pHF is approximately zero). Thus, the concentration of the gaseous products/reactants in the film is not controlled by the diffusion through the gas/film surface boundary layer condition, but rather by diffusion through the film. In order to minimize the nucleation of a-axis $YBa_2Cu_3O_{7-x}$ oriented grains on a substrate surface, the formation of the $YBa_2Cu_3O_{7-x}$ phase is inhibited until desired process conditions are reached. For example, the formation of the $YBa_2Cu_3O_{7-x}$ phase can be inhibited until desired process temperature is reached.

In one embodiment, a combination of: 1) low (non-turbulent) process gas flow, so that a stable boundary layer is established at the film/gas interface, during the ramp to temperature, and 2) high (turbulent) process gas flow, so that the boundary layer is disrupted at the film/gas interface, is employed. For example, in a three inch tube furnace, the flow can be from about 0.5 to about 2.0 L/min during the temperature ramp from ambient temperature to the desired process temperature. Thereafter, the flow can be increased to a value of from about 4 to about 15 L/min during the time at which the film is being processed. Thus, the rate of formation of $YBa_2Cu_3O_{7-x}$ and epitaxial texture formation can be increased at high temperature, while minimizing the amount of unwanted a-axis nucleation and growth at low temperature during ramp up. According to these processes, a-axis nucleated grains are desirably present in an amount of less than about 1%, as determined by scanning electron microscopy.

More details are provided in commonly owned U.S. patent application Ser. No. 09/616,566, filed on Jul. 14, 2000, and entitled "Control of Oxide Layer Reaction Rates," which is hereby incorporated by reference.

In preferred embodiments, layer 14 has a relatively high critical current density (e.g., at least about $0.5 \times 10^6$ Amperes per square centimeter). Preferably, layer 14 has a critical current density of at least about $0.5 \times 10^6$ Amperes per square centimeter, more preferably at least about $1 \times 10^6$ Amperes per square centimeter, and most preferably at least about $2 \times 10^6$ Amperes per square centimeter, as determined by transport measurement at 77 K in self field (i.e., no applied field) using a 1 microVolt per centimeter criterion.

In certain embodiments, layer 14 can provide a relatively high critical current, as measured in unites of Amperes per unit width. As an example, the critical current can be expressed in units of Amperes per centimeter width. Of course, layer 14 need not be one centimeter wide. Rather, this value can be used for convenience to normalize the current to width ratio value for materials having different widths. As an example, a sample that has a current of 100 Amperes and is 0.5 centimeter wide would have a critical current of 200 Amperes per centimeter width. A sample that provides a current of 200 Amperes and is one centimeter wide would also has a critical current of 200 Amperes per centimeter width. In preferred embodiments, layer 14 has a critical current of at least about 200 Amperes per centimeter of width (e.g., at least about 300 Amperes per centimeter of width, at least about 500 centimeters per centimeter of width).

In preferred embodiments, layer 14 is well-ordered (e.g., biaxially textured or cube textured). Layer 14 can be at least about one micrometer thick (e.g., at least about two micrometers thick, at least about three micrometers thick, at least about four micrometers thick, at least about five micrometers thick).

Figure 2:
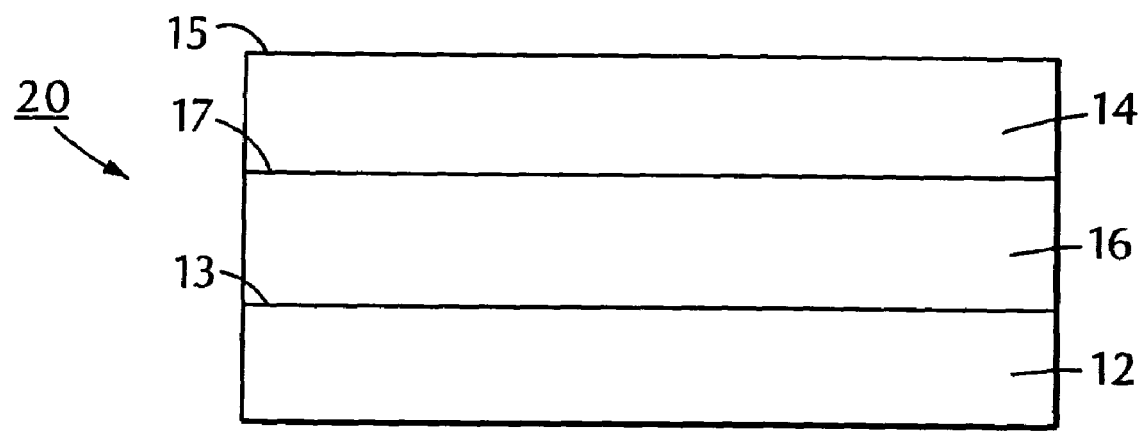
FIG. 2 is a cross-sectional view of another embodiment of a multi-layer article.

FIG. 2 shows an embodiment of an article 20 that can be formed by the methods of the invention. Article 20 includes layers 12 and 14. Article 20 also includes a layer 16 disposed between layers 12 and 14 such that layer 16 is disposed on surface 13 and layer 14 is disposed on a surface 17 of layer 16.

Layer 16 can be formed of any material capable of supporting layer 14. For example, layer 16 can be formed of one or more layers of buffer layer material. Examples of buffer layer materials include metals and metal oxides, such as silver, nickel, $TbO_x$, $GaO_x$, $CeO_2$, yttria-stabilized zirconia (YSZ), $Y_2O_3$, $LaAlO_3$, $SrTiO_3$, $Gd_2O_3$, $LaNiO_3$, $LaCuO_3$, $SrRuO_3$, $NdGaO_3$, $NdAlO_3$ and/or some nitrides as known to those skilled in the art. A buffer material can be prepared using solution phase techniques, including metalorganic deposition, such as disclosed in, for example, S. S. Shoup et al., J. Am. Cer. Soc., vol. 81, 3019; D. Beach et al., Mat. Res. Soc. Symp. Proc., vol. 495, 263 (1988); M. Paranthaman et al., Superconductor Sci. Tech., vol. 12, 319 (1999); D. J. Lee et al., Japanese J. Appl. Phys., vol. 38, L178 (1999) and M. W. Rupich et al., I.E.E.E. Trans. on Appl. Supercon. vol. 9, 1527.

In certain embodiments, solution coating processes can be used for deposition of one or a combination of any of the oxide layers on textured substrates; however, they can be particularly applicable for deposition of the initial (seed) layer on a textured metal substrate. The role of the seed layer is to provide 1) protection of the substrate from oxidation during deposition of the next oxide layer when carried out in an oxidizing atmosphere relative to the substrate (for example, magnetron sputter deposition of yttria-stabilized zirconia from an oxide target); and 2) an epitaxial template for growth of subsequent oxide layers. In order to meet these requirements, the seed layer should grow epitaxially over the entire surface of the metal substrate and be free of any contaminants that may interfere with the deposition of subsequent epitaxial oxide layers.

The formation of oxide buffer layers can be carried out so as to promote wetting of an underlying substrate layer. Additionally, in particular embodiments, the formation of metal oxide layers can be carried out using metal alkoxide precursors (for example, "sol gel" precursors), in which the level of carbon contamination can be greatly reduced over other known processes using metal alkoxide precursors.

If the substrate underlying an oxide layer is insufficiently covered by a precursor solution used to make the oxide layer, then the oxide layer will not provide the desired protection of the substrate from oxidation during deposition of the subsequent oxide layers when carried out in an oxidizing atmosphere relative to the substrate and will not provide a complete template for the epitaxial growth of subsequent layers. By heating a sol gel precursor film, and thereby allowing the precursor to flow into the substrate grain boundary areas, complete coverage can result. The heating can be relatively low temperature, for example, from about 80° C. to about 320° C., for example, from about 100° C. to about 300° C., or from about 100° C. to about 200° C. Such temperatures can be maintained from about 1 to about 60 minutes, for example, from about 2 to about 45 minutes, or from about 15 to about 45 minutes. The heating step can also be carried out using higher temperatures for a shorter time, for example, a film can be processed within two minutes at a temperature of 300° C.

This heating step can be carried out after, or concurrently with, the drying of excess solvent from the sol gel precursor film. It must be carried out prior to decomposition of the precursor film, however.

The carbon contamination accompanying conventional oxide film preparation in a reducing environment (e.g., 4% $H_2$—Ar) is believed to be the result of an incomplete removal of the organic components of the precursor film. The presence of carbon-containing contaminants $C_xH_y$ and $C_aH_bO_c$ in or near the oxide layer can be detrimental, since they can alter the epitaxial deposition of subsequent oxide layers. Additionally, it is likely that the trapped carbon-containing contaminants buried in the film can be oxidized during the processing steps for subsequent oxide layers, which can utilize oxidizing atmospheres. The oxidation of the carbon-containing contaminants can result in $CO_2$ formation, and the subsequent blistering of the film, and possible delamination of the film, or other defects in the composite structure. Thus, it is undesirable to allow carbon-containing contaminants arising from metal alkoxide decomposition to become oxidized only after the oxide layer is formed. Preferably, the carbon-containing contaminants are oxidized (and hence removed from the film structure as $CO_2$) as the decomposition occurs. Also the presence of carbon-containing species on or near film surfaces can inhibit the epitaxial growth of subsequent oxide layers.

According to particular embodiments, after coating a metal substrate or buffer layer, the precursor solution can be air dried, and then heated in an initial decomposition step. Alternatively, the precursor solution can be directly heated in an initial decomposition step, under an atmosphere that is reducing relative to the metal substrate. Once the oxide layer initially nucleates on the metal substrate in the desired epitaxial orientation, the oxygen level of the process gas is increased, for example, by adding water vapor or oxygen. The nucleation step requires from about 5 minutes to about 30 minutes to take place under typical conditions.

These methods are described in U.S. patent application Ser. No. 09/617,520, filed on Jul. 14, 2000, and entitled "Enhanced Purity Oxide Layer Formation," which is hereby incorporated by reference.

In certain embodiments, an epitaxial buffer layer can be formed using a low vacuum vapor deposition process (e.g., a process performed at a pressure of at least about $1 \times 10^{-3}$ Torr). The process can include forming the epitaxial layer using a relatively high velocity and/or focused gas beam of buffer layer material.

The buffer layer material in the gas beam can have a velocity of greater than about one meter per second (e.g., greater than about 10 meters per second or greater than about 100 meters per second). At least about 50% of the buffer layer material in the beam can be incident on the target surface (e.g., at least about 75% of the buffer layer material in the beam can be incident on the target surface, or at least about 90% of the buffer layer material in the beam can be incident on the target surface).

The method can include placing a target surface (e.g., a substrate surface or a buffer layer surface) in a low vacuum environment, and heating the target surface to a temperature which is greater than the threshold temperature for forming an epitaxial layer of the desired material on the target surface in a high vacuum environment (e.g., less than about $1 \times 10^{-3}$ Torr, such as less than about $1 \times 10^{-4}$ Torr) under otherwise identical conditions. A gas beam containing the buffer layer material and optionally an inert carrier gas is directed at the target surface at a velocity of at least about one meter per second. A conditioning gas is provided in the low vacuum environment. The conditioning gas can be contained in the gas beam, or the conditioning gas can be introduced into the low vacuum environment in a different manner (e.g., leaked into the environment). The conditioning gas can react with species (e.g., contaminants) present at the target surface to remove the species, which can promote the nucleation of the epitaxial buffer layer.

The epitaxial buffer layer can be grown on a target surface using a low vacuum (e.g., at least about $1 \times 10^{-3}$ Torr, at least about 0.1 Torr, or at least about 1 Torr) at a surface temperature below the temperature used to grow the epitaxial layer using physical vapor deposition at a high vacuum (e.g., at most about $1 \times 10^{-4}$ Torr). The temperature of the target surface can be, for example, from about 25° C. to about 800° C. (e.g., from about 500° C. to about 800° C., or from about 500° C. to about 650° C.).

The epitaxial layer can be grown at a relatively fast rate, such as, for example, at least about 50 Angstroms per second.

These methods are described in U.S. Pat. No. 6,027,564, issued Feb. 22, 2000, and entitled "Low Vacuum Process for Producing Epitaxial Layers;" U.S. Pat. No. 6,022,832, issued Feb. 8, 2000, and entitled "Low Vacuum Process for Producing Superconductor Articles with Epitaxial Layers;" and/or commonly owned U.S. patent application Ser. No. 09/007,372, filed Jan. 15, 1998, and entitled "Low Vacuum Process for Producing Epitaxial Layers of Semiconductor Material," all of which are hereby incorporated by reference.

In alternate embodiments, an epitaxial buffer layer can be deposited by sputtering from a metal or metal oxide target at a high throughput. Heating of the substrate can be accomplished by resistive heating or bias and electric potential to obtain an epitaxial morphology. A deposition dwell may be used to form an oxide epitaxial film from a metal or metal oxide target.

The oxide layer typically present on substrates can be removed by exposure of the substrate surface to energetic ions within a reducing environment, also known as Ion Beam etching. Ion Beam etching can be used to clean the substrate prior to film deposition, by removing residual oxide or impurities from the substrate, and producing an essentially oxide-free preferably biaxially textured substrate surface. This improves the contact between the substrate and subsequently deposited material. Energetic ions can be produced by various ion guns, for example, which accelerate ions such as $Ar^+$ toward a substrate surface. Preferably, gridded ion sources with beam voltages greater than 150 ev are utilized. Alternatively, a plasma can be established in a region near the substrate surface. Within this region, ions chemically interact with a substrate surface to remove material from that surface, including metal oxides, to produce substantially oxide-free metal surface.

Another method to remove oxide layers from a substrate is to electrically bias the substrate. If the substrate tape or wire is made negative with respect to the anode potential, it will be subjected to a steady bombardment by ions from the gas prior to the deposition (if the target is shuttered) or during the entire film deposition. This ion bombardment can clean the wire or tape surface of absorbed gases that might otherwise be incorporated in the film and also heat the substrate to elevated deposition temperatures. Such ion bombardment can be further advantageous by improving the density or smoothness of the epitaxial film.

Upon formation of an appropriately textured, substantially oxide-free substrate surface, deposition of a buffer layer can begin. One or more buffer layers, each including a single metal or oxide layer, can be used. In some embodiments, the substrate is allowed to pass through an apparatus adapted to carry out steps of the deposition method of these embodiments. For example, if the substrate is in the form of a wire or tape, the substrate can be passed linearly from a payout reel to a take-up reel, and steps can be performed on the substrate as it passes between the reels.

According to some embodiments, substrate materials are heated to elevated temperatures which are less than about 90% of the melting point of the substrate material but greater than the threshold temperature for forming an epitaxial layer of the desired material on the substrate material in a vacuum environment at the predetermined deposition rate. In order to form the appropriate buffer layer crystal structure and buffer layer smoothness, high substrate temperatures are generally preferred. Typical lower limit temperatures for the growth of oxide layers on metal are approximately 200□C to 800□C, preferably 500□C to 800□C, and more preferably, 650□C to 800□C. Various well-known methods such as radiative heating, convection heating, and conduction heating are suitable for short (2 cm to 10 cm) lengths of substrate, but for longer (1 m to 100 m) lengths, these techniques may not be well suited. Also to obtain desired high throughput rates in a manufacturing process, the substrate wire or tape must be moving or transferring between deposition stations during the process. According to particular embodiments, the substrates are heated by resistive heating, that is, by passing a current through the metal substrate, which is easily scaleable to long length manufacturing processes. This approach works well while instantaneously allowing for rapid travel between these zones. Temperature control can be accomplished by using optical pyrometers and closed loop feedback systems to control the power supplied to the substrate being heated. Current can be supplied to the substrate by electrodes which contact the substrate in at least two different segments of the substrate. For example, if the substrate, in the form of a tape or wire, is passed between reels, the reels themselves could act as electrodes. Alternatively, if guides are employed to transfer the substrate between reels, the guides could act as electrodes. The electrodes could also be completely independent of any guides or reels as well. In some embodiments, current is applied to the tape between current wheels.

In order that the deposition is carried out on tape that is at the appropriate temperature, the metal or oxide material that is deposited onto the tape is desirably deposited in a region between the current wheels. Because the current wheels can be efficient heat sinks and can thus cool the tape in regions proximate to the wheels, material is desirably not deposited in regions proximate to the wheels. In the case of sputtering, the charged material deposited onto the tape is desirably not influenced by other charged surfaces or materials proximate to the sputter flux path. For this reason, the sputter chamber is preferably configured to place components and surfaces which could influence or deflect the sputter flux, including chamber walls, and other deposition elements, in locations distant from the deposition zone so that they do not alter the desired linear flux path and deposition of metal or metal oxide in regions of the tape at the proper deposition temperature.

More details are provided in commonly owned U.S. patent application Ser. No. 09/500,701, filed on Feb. 9, 2000, and entitled "Oxide Layer Method," and commonly owned U.S. patent application Ser. No. 09/615,669, filed on Jul. 14, 2000, and entitled "Oxide Layer Method," both of which are hereby incorporated by reference in their entirety.

In certain embodiments, layer 16 can be conditioned (e.g., thermally conditioned and/or chemically conditioned) so that layer 14 is formed on a conditioned surface. The conditioned surface of the layer 16 can be biaxially textured (e.g., (113)[211]) or cube textured (e.g., (100)[011] or (100)[011]), have peaks in an X-ray diffraction pole figure that have a full width at half maximum of less than about 20° (e.g., less than about 15°, less than about 10°, or from about 5° to about 10°), be smoother than before conditioning as determined by high resolution scanning electron microscopy or atomic force microscopy, have a relatively high density, have a relatively low density of impurities, exhibit enhanced adhesion to other material layers (e.g., a superconductor layer or a buffer layer) and/or exhibit a relatively small rocking curve width as measured by x-ray diffraction.

"Chemical conditioning" as used herein refers to a process which uses one or more chemical species (e.g., gas phase chemical species and/or solution phase chemical species) to affect changes in the surface of a material layer, such as a buffer layer or a superconductor material layer, so that the resulting surface exhibits one or more of the above noted properties.

"Thermal conditioning" as used herein refers to a process which uses elevated temperature, with or without chemical conditioning, to affect changes in the surface of a material layer, such as a buffer layer or a superconductor material layer, so that the resulting surface exhibits one or more of the above noted properties. Thermal conditioning can be performed with or without the use of chemical conditioning. Preferably, thermal conditioning occurs in a controlled environment (e.g., controlled gas pressure, controlled gas environment and/or controlled temperature).

Thermal conditioning can include heating the surface of the layer 16 to a temperature at least about 5° C. above the deposition temperature or the crystallization temperature of the underlying layer (e.g., from about 15° C. to about 500° C. above the deposition temperature or the crystallization temperature of the underlying layer, from about 75° C. to about 300° C. above the deposition temperature or the crystallization temperature of the underlying layer, or from about 150° C. to about 300° C. above the deposition temperature or the crystallization temperature of the underlying layer). Examples of such temperatures are from about 500° C. to about 1200° C. (e.g., from about 800° C. to about 1050° C.). Thermal conditioning can be performed under a variety of pressure conditions, such as above atmospheric pressure, below atmospheric pressure, or at atmospheric pressure. Thermal conditioning can also be performed using a variety of gas environments, such as a chemical conditioning environment (e.g., an oxidizing gas environment, a reducing gas environment) or an inert gas environment.

"Deposition temperature" as used herein refers to the temperature at which the layer being conditioned was deposited.

"Crystallization temperature" as used herein refers to the temperature at which a layer of material (e.g., the underlying layer) takes on a crystalline form.

Chemical conditioning can include vacuum techniques (e.g., reactive ion etching, plasma etching and/or etching with fluorine compounds, such as $BF_3$ and/or $CF_4$). Chemical conditioning techniques are disclosed, for example, in *Silicon Processing for the VLSI Era*, Vol. 1, eds. S. Wolf and R. N. Tanber, pp. 539-574, Lattice Press, Sunset Park, Calif., 1986.

Alternatively or additionally, chemical conditioning can involve solution phase techniques, such as disclosed in *Metallurgy and Metallurgical Engineering Series*, 3d ed., George L. Kehl, McGraw-Hill, 1949. Such techniques can include contacting the surface of the underlying layer with a relatively mild acid solution (e.g., an acid solution containing less about 10 percent acid, less than about two percent acid, or less than about one percent acid). Examples of mild acid solutions include perchloric acid, nitric acid, hydrofluoric acid, hydrochloric acid, acetic acid and buffered acid solutions. In one embodiment, the mild acid solution is about one percent aqueous nitric acid. In certain embodiments, bromide-containing and/or bromine-containing compositions (e.g., a liquid bromine solution) can be used to condition the surface of a buffer layer or a superconductor layer.

These methods are described in commonly owned U.S. Provisional Patent Application No. 60/166,140, filed Nov. 18, 1999, and entitled "Multi-Layer Articles and Methods of Making Same," and commonly owned U.S. patent application Ser. No. 09/615,999, filed on Jul. 14, 2000, and entitled "Multi-layer Articles and Methods of Making Same," both of which are hereby incorporated by reference.

Alternatively, layer 16 can be formed of a superconductor material, which can be prepared as described above. In embodiments in which layer 16 is formed of a superconductor material, the relative thickness of layers 16 and 14 can vary depending upon the method used to prepare article 20 and/or the intended use of article 20. For example, layer 14 can be thicker than layer 16, or layer 16 can be thicker than layer 14. For example, in some embodiments, layer 16 can have a thickness of less than about one micrometer (e.g., less than about 0.5 micrometer, such as from about 0.05 micrometer to about 0.2 micrometer), and layer 14 can have a thickness of greater than about one micrometer (e.g., greater than about two micrometers, greater than about three micrometers, greater than about four micrometers, greater than about five micrometers).

In embodiments in which layer 16 is formed of a superconductor material, the combined thickness of layers 14 and 16 can vary depending upon the methods used to prepare article 20 and/or the intended use of article 20. For example, the combined thickness of layers 14 and 16 can be less than two micrometers or greater than two micrometers. Preferably, the combined thickness of layers 14 and 16 is greater than about one micrometer (e.g., greater than about two micrometers, greater than about three micrometers, greater than about four micrometers, greater than about five micrometers, greater than about six micrometers, greater than about seven micrometers, greater than about eight micrometers, greater than about nine micrometers, greater than about 10 micrometers).

In embodiments in which layer 16 is formed of a superconductor material, the surface of layer 16 can be chemically and/or thermally conditioned as described above.

In certain embodiments, where layer 16 is formed of a superconductor material, layer 14 can be from solid-state, or semi solid state, precursor materials deposited in the form of a dispersion. These precursor solutions allow for example the substantial elimination of $BaCO_3$ formation in final YBCO superconducting layers, while also allowing control of film nucleation and growth.

Two general approaches are presented for the formulation of precursor solutions. In one approach, the cationic constituents of the precursor solution are provided in components taking on a solid form, either as elements, or preferably, compounded with other elements. The precursor solution is provided in the form of ultrafine particles which are dispersed so that they can be coated onto and adhere onto the surface of a suitable substrate, intermediate-coated substrate, or buffer-coated substrate. These ultrafine particles can be created by aerosol spray, by evaporation or by similar techniques which can be controlled to provide the chemical compositions and sizes desired. The ultrafine particles are less than about 500 nm, preferably less than about 250 nm, more preferably less than about 100 nm and even more preferably less than about 50 nm. In general, the particles are less than about 50% the thickness of the desired final film thickness, preferably less than about 30% most preferably less than about 10% of the thickness of the desired final film thickness. For example, the precursor solution can comprise ultrafine particles of one or more of the constituents of the superconducting layer in a substantially stoichiometric mixture, present in a carrier. This carrier comprises a solvent, a plasticizer, a binder, a dispersant, or a similar system known in the art, to form a dispersion of such particles. Each ultrafine particle can contain a substantially compositionally uniform, homogeneous mixture of such constituents. For example, each particle can contain $BaF_2$, and rare-earth oxide, and copper oxide or rare earth/barium/copper oxyhalide in a substantially stoichiometric mixture. Analysis of such particles would desirably reveal a rare-earth:barium: copper ratio as substantially 1:2:3 in stoichiometry, with a fluorine:barium ratio of substantially 2:1 in stoichiometry. These particles can be either crystalline, or amorphous in form.

In a second approach, the precursor components can be prepared from elemental sources, or from a substantially stoichiometric compound comprising the desired constituents. For example, evaporation of a solid comprising a substantially stoichiometric compound of desired REBCO constituents (for example, $YBa_2Cu_3O_{7-x}$) or a number of solids, each containing a particular constituent of the desired final superconducting layer (for example, $Y_2O_3$, $BaF_2$, CuO) could be used to produce the ultrafine particles for production of the precursor solutions. Alternatively, spray drying or aerosolization of a metalorganic solution comprising a substantially stoichiometric mixture of desired REBCO constituents could be used to produce the ultrafine particles used in the precursor solutions. Alternatively, one or more of the cationic constituents can be provided in the precursor solution as a metalorganic salt or metalorganic compound, and can be present in solution. The metalorganic solution can act as a solvent, or carrier, for the other solid-state elements or compounds. According to this embodiment, dispersants and/ or binders can be substantially eliminated from the precursor solution. For example, the precursor solution can comprise ultrafine particles of rare-earth oxide and copper oxide in substantially a 1:3 stoichiometric ratio, along with a solublized barium-containing salt, for example, barium-trifluoroacetate dissolved in an organic solvent, such as methanol.

The precursor solutions can be applied to substrate or buffer-treated substrates by a number of methods, which are designed to produce coatings of substantially homogeneous thickness. For example, the precursor solutions can be applied using spin coating, slot coating, gravure coating, dip coating, tape casting, or spraying. The substrate is desirably uniformly coated to yield a superconducting film of from about one to 10 micrometers (e.g., at least about one micrometer, at least about two micrometers, at least about three micrometers, at least about four micrometers, at least about five micrometers).

More details are provided in commonly owned U.S. patent application Ser. No. 09/500,717, filed on Feb. 9, 2000, and entitled "Coated Conductor Thick Film Precursor," which is hereby incorporated by reference in its entirety.

In embodiments in which layer 16 is formed of a superconductor material, the critical current density of the combined layers 14 and 16 in article 20 can be relatively high. Preferably, the critical current density of the combined layers 14 and 16 in article 20 is at least about $5 \times 10^5$ Amperes per square centimeter, more preferably at least about $1 \times 10^6$ Amperes per square centimeter, such as at least about $2 \times 10^6$ Amperes per square centimeter as determined by transport measurement at 77 K in self field using a 1 microvolt per centimeter criterion.

Figure 3:
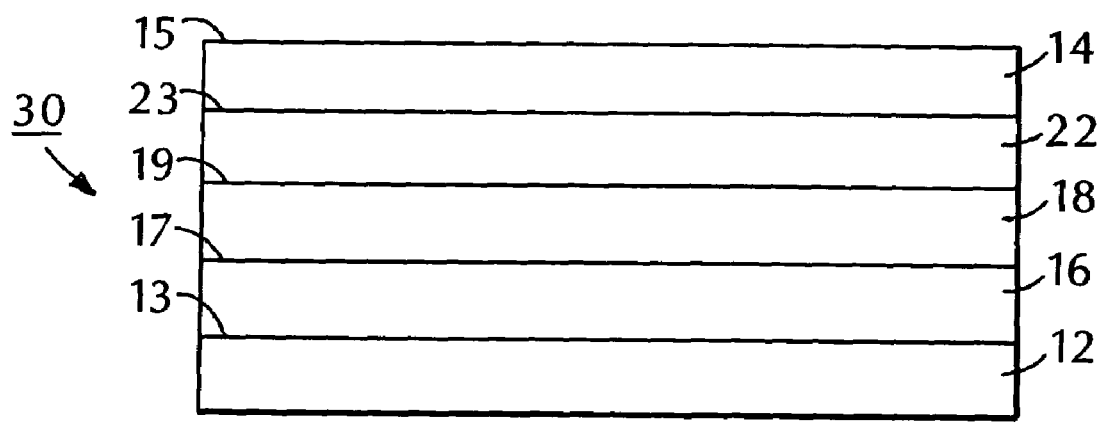
FIG. 3 is a cross-sectional view of a further embodiment of a multi-layer article.

While the foregoing discussion has described multi-layer articles having two layers of material (i.e., no intermediate layer) and three layers of material (i.e., one intermediate layer), the invention is not limited in this sense. Instead, multiple intermediate layers can be used. Each of the intermediate layers can be formed of a buffer layer material or a superconductor material. For example, FIG. 3 shows a multi-layer superconductor 30 according to yet another embodiment of the invention. Article 30 includes layers 12, 14 and 16. Article 30 further includes an additional intermediate layer(s) 18 and 22 having surfaces 19 and 23, respectively. Layers 18 and 22 are disposed between layers 16 and 14. Each of layers 16, 18 and 22 can be formed of a buffer layer material or a superconductor material. Moreover, surfaces 19 and 23 can be prepared using the methods discussed herein.

In some embodiments, a superconductor article includes three buffer layers between the substrate and superconductor material. A layer of $Y_2O_3$ or $CeO_2$ (e.g., from about 20 nanometers to about 50 nanometers thick) is deposited (e.g., using electron beam evaporation) onto the substrate surface, or a layer of $Gd_2O_3$ is deposited from solution. A layer of YSZ (e.g., from about 0.2 micrometer to about 1 micrometer thick, such as about 0.5 micrometer thick) is deposited onto the surface of the $Y_2O_3$, $CeO_2$ or $Gd_2O_3$ layer using sputtering (e.g, using magnetron sputtering). A $CeO_2$ layer (e.g., about 20 nanometers thick) is deposited (e.g, using magnetron sputtering) onto the YSZ surface, or a layer of $Gd_2O_3$ is deposited from solution onto the YSZ surface. One or more of the buffer layers can be chemically and/or thermally conditioned as described herein.

Superconductor articles according to the invention can also include a layer of a cap material which can be formed of a metal or alloy whose reaction products with the superconductor material (e.g., $YBa_2Cu_3O_{7-x}$) are thermodynamically unstable under the reaction conditions used to form the layer of cap material. Exemplary cap materials include silver, gold, palladium and platinum.

In addition, while the foregoing discussion has described multi-layer articles having certain structures, the invention is not limited in this sense. For example, in some embodiments, multi-layer high temperature superconductors are provided, including first and second high temperature superconductor coated elements. Each element includes a substrate, at least one buffer layer deposited on the substrate, a high temperature superconductor layer, and optionally a cap layer. The first and second high temperature superconductor coated elements can be joined at the first and second cap layers, or can be joined with an intervening, preferably metallic, layer. Exemplary joining techniques include soldering and diffusion bonding.

Such a multi-layer architecture can provide improved current sharing, lower hysteretic losses under alternating current conditions, enhanced electrical and thermal stability, and improved mechanical properties. Useful conductors can be made having multiple tapes stacked relative to one another and/or laminated to provide sufficient ampacity, dimensional stability, and mechanical strength. Such embodiments also provide a means for splicing coated tape segments and for termination of coated tape stackups or conductor elements.

Moreover, it is expected that this architecture can provide significant benefits for alternating current applications. AC losses are shown to be inversely proportional to the effective critical current density within the conductor, more specifically, the cross-sectional area within which the current is carried. For a multifilimentary conductor, this would be the area of the "bundle" of superconducting filaments, excluding any sheath material around that bundle. For a "face-to-face" architecture, the "bundle" critical current density would encompass only the high temperature superconductor films and the thickness of the cap layer structure. The cap layer can be formed of one or more layers, and preferably includes at least one noble metal layer. "Noble metal," as used herein, is a metal, the reaction products of which are thermodynamically unstable under the reaction conditions employed to prepare the HTS tape. Exemplary noble metals include, for example, silver, gold, palladium, and platinum. Noble metals provide a low interfacial resistance between the HTS layer and the cap layer. In addition, the cap layer can include a second layer of normal metal (for example, copper or aluminum or alloys of normal metals). In direct current applications, additional face-to-face wires would be bundled or stacked to provide for the required ampacity and geometry for a given application.

Additionally, the high temperature superconductor film on the surface of the tapes could be treated to produce local breaks, that is, non-superconducting regions or stripes in the film only along the length of the tape (in the current flow direction). The cap layer deposited on the high temperature superconductor film would then serve to bridge the nonsuperconducting zones with a ductile normal metal region. An offset in the edge justification of the narrow strips or filaments, similar to a running bond brick pattern, would allow current to transfer to several narrow superconducting filaments both across the cap layers and to adjacent filaments, further increasing the redundancy and improving stability.

In all embodiments, a normal metal layer could be included along the edge of the conductor to hermetically seal the high temperature superconductor films and to provide for current transfer into the film, and if necessary, from the film into the substrate.

More details are provided in commonly owned U.S. Provisional Patent Application Ser. No. 60/145,468, filed on Jul. 23, 1999, and entitled "Enhanced High Temperature Coated Superconductors," and commonly owned U.S. patent application Ser. No. 09/617,518, filed on Jul. 14, 2000, and entitled "Enhanced High Temperature Coated Superconductors," both of which are hereby incorporated by reference in its entirety.

In some embodiments, coated conductors can be fabricated in a way that minimizes losses incurred in alternating current applications. The conductors are fabricated with multiple conducting paths, each of which comprises path segments which extend across at least two conducting layers, and further extend between these layers.

Each superconducting layer has a plurality of conductive path segments extending across the width of the layer, from one edge to another, and the path segments also have a component of direction along the length of the superconducting layer. The path segments in the superconducting layer surface are in electrically conductive communication with interlayer connections, which serve to allow current to flow from one superconducting layer to another. Paths, which are made up of path segments, are periodically designed, so that current flow generally alternates between two superconducting layers in bilayered embodiments, and traverses the layers through interlayer connections.

Superconducting layers can be constructed to contain a plurality of path segments which extend both across their widths and along their lengths. For example, superconducting layers can be patterned so as to achieve a high resistivity or a fully insulating barrier between each of the plurality of path segments. For example, a regular periodic array of diagonal path segments can be imposed on the layer along the full length of the tape. Patterning of superconducting layers to give such arrays can be accomplished by a variety of means known to those skilled in the art, including for example, laser scribing, mechanical cutting, implantation, localized chemical treatment through a mask, and other known methods. Further, the superconducting layers are adapted to allow the conductive path segments in their surfaces to electrically communicate with conducting interlayer connections passing between the layers, at or near their edges. The interlayer connections will typically be normally conducting (not superconducting) but in special configurations could also be superconducting. Interlayer connections provide electrical communication between superconducting layers which are separated by non-conducting or highly resistive material which is positioned between the superconducting layers. Such non-conducting or highly resistive material can be deposited on one superconducting layer. Passages can be fabricated at the edges of the insulating material to allow the introduction of interlayer connections, followed by deposition of a further superconducting layer. One can achieve a transposed configuration with coated conductors by patterning a superconducting layer into filaments parallel to the axis of the tape and winding the tape in a helical fashion around a cylindrical form.

More details are provided in commonly owned U.S. patent application Ser. No. 09/500,718, filed on Feb. 9, 2000, and entitled "Coated Conductors with Reduced AC Loss," which is hereby incorporated by reference in its entirety.

The following examples are illustrative only.

EXAMPLE I

A precursor solution was prepared as follows. About 1.36 grams of $Y(CF_3CO_2)_3 \cdot 4H_2O$, about 2.46 grams of $Ba(CF_3CO_2)_2$ and about 2.51 grams of $Cu(CF_3CO_2)_2 \cdot 2H_2O$ were dissolved in about 5 milliliters of $CH_3OH$. About 0.86 milliliters of water was then added and the total volume of the solution was adjusted to about 10 milliliters with methanol.

The precursor solution was spin coated onto the (100) surface of a single crystal $SrTiO_3$ substrate as follows. The substrate was ramped from about zero revolutions per minute (RPM) to about 2000 RPM in about 0.5 seconds. The spin speed was held at about 2000 RPM for about five seconds, and then ramped to about 4000 RPM in about 0.5 seconds. The spin speed was held at about 4000 RPM for about 60 seconds, then reduced to about zero RPM.

The coated sample was decomposed as follows. The sample was heated from room temperature to about 210° C. at a rate of about 10° C. per minute in a nominal gas environment having a total gas pressure of about 760 Torr (water vapor pressure of about 24 Torr and balance oxygen). Heating was conducted in an about 2.25" diameter furnace using a gas flow rate of about 4.5 standard cubic feet per hour. While keeping substantially the same nominal gas environment, the temperature was increased to about 220° C. at a rate of about 0.5° C. per minute, followed by heating to about 400° C. at a rate of about 5° C. per minute to form an intermediate thin film.

After decomposition, the intermediate film was heated to about 725° C. at a rate of about 10° C. per minute and held for about three hours in an environment having a nominal total gas pressure of about 760 Torr (water vapor pressure of about 17 Torr, oxygen gas pressure of about 76 millitorr and balance oxygen) followed by holding the temperature at about 725° C. for about 10 minutes in an environment having a nominal total gas pressure of about 760 Torr (oxygen gas pressure of about 76 millitorr and balance nitrogen). The film was cooled to about 450° C. in the same nominal gas environment and was held at this temperature for about an hour in a gas environment having a nominal total gas pressure of about 760 Torr (about 760 Torr oxygen) and subsequently cooled to room temperature.

The resulting layer was (001) textured $YBa_2Cu_3O_{7-x}$ and about 0.4 micrometers thick.

EXAMPLE II

A precursor solution was prepared as follows. About 1.41 grams of $Y(CF_3CO_2)_3$, about 2.39 grams of $Ba(CF_3CO_2)_2$ and about 1.97 grams of $Cu(CH_3CO_2)_2 \cdot 2H_2O$ were dissolved in about 20 milliliters of $CH_3OH$, about 10 milliliters of water and about 0.5 milliliters of $NH_4OH$. This solution was then concentrated to about 20 milliliters by removal of solvent under vacuum.

The concentrated precursor solution was spin coated onto the (100) surface of a single crystal $SrTiO_3$ substrate and decomposed as described in Example I to form a film of an intermediate.

Figure 4:
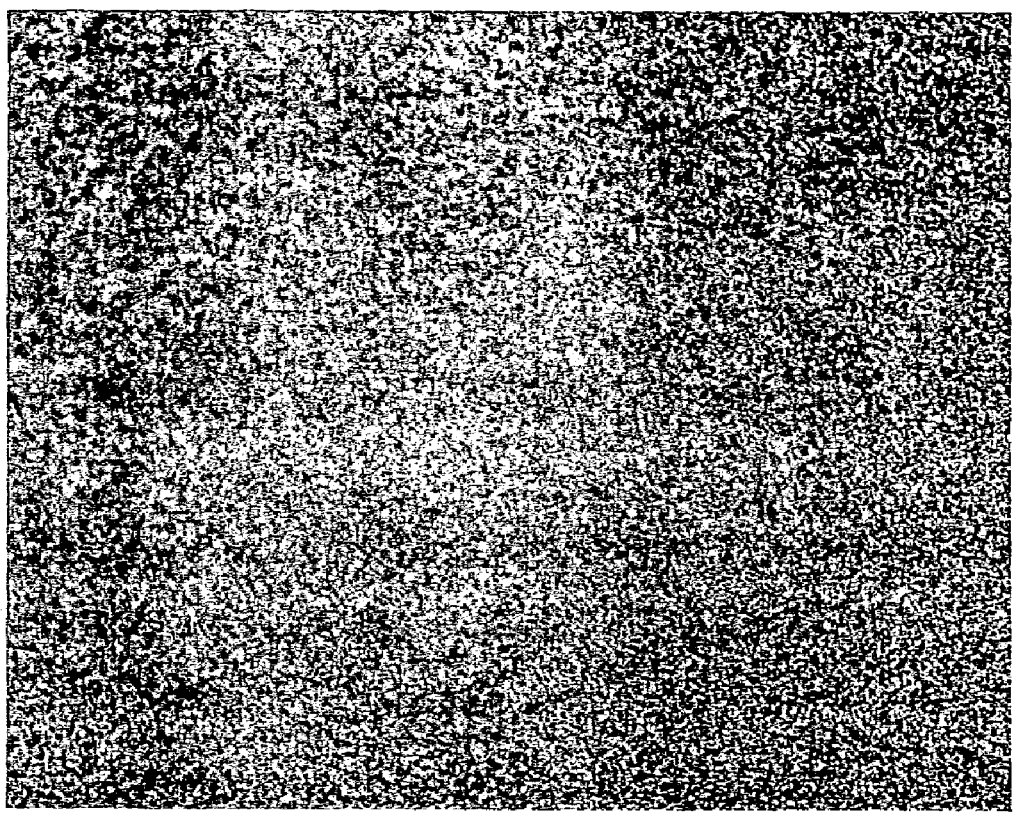
FIG. 4 is an optical micrograph of a film of an intermediate material.

The thickness of the film of the intermediate was about 0.95 micrometers. FIG. 4 is an optical micrograph of the film (750× magnification), showing that the film had no visible cracks or blisters.

The decomposed film was then reacted as in Example I to form a $YBa_2Cu_3O_{7-x}$ film.

EXAMPLE III

Figure 5:
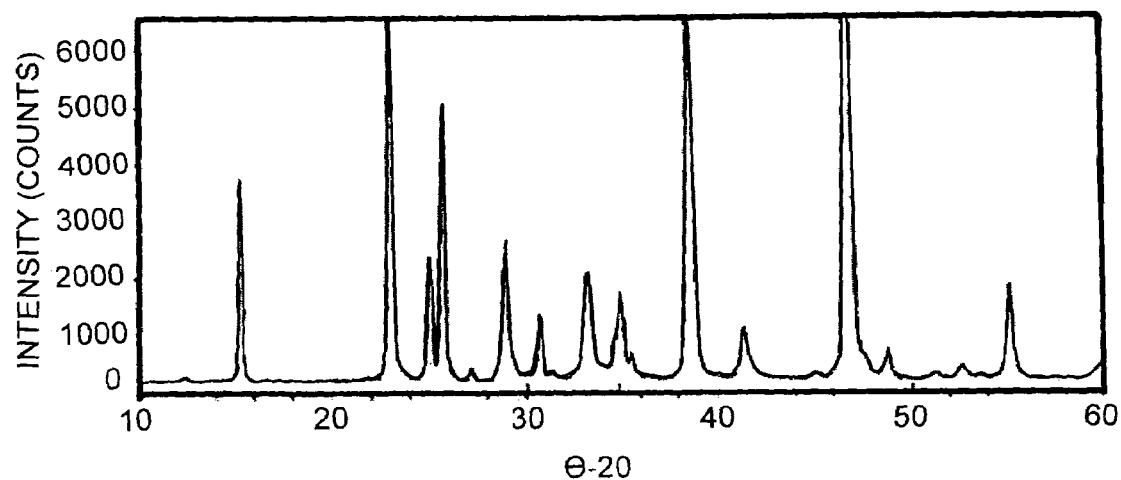
FIG. 5 is a θ-2θ X-ray diffraction scan of a film of $YBa_2Cu_3O_{7-x\alpha\beta}$.

Example II was repeated, except that spin rates of 500 RPM rather than 2000 RPM, and 1000 RPM rather than 4000 RPM were used. After decomposition of the precursor film, the intermediate film was about 1.4 micrometers thick. The film was further reacted as in Example I to form a $YBa_2Cu_3O_{7-x}$ film. FIG. 5 is a θ-2θ X-ray diffraction scan of the $YBa_2Cu_3O_{7-x}$ film, showing substantial formation of textured $YBa_2Cu_3O_{7-x}$ along with minor unidentified impurity phases.

EXAMPLE IV

A precursor solution was prepared as follows. About 1.98 grams of $Cu(CCl_3CO_2)_2 \cdot xH_2O$ was dissolved in about 10 milliliters of methanol. About 2.46 grams of $Y(CF_3CO_2)_3$ and about 1.20 grams of $Ba(CF_3CO_2)_2$ were added while stirring. The solution was concentrated to about five milliliters by evaporation of solvent under vacuum. The concentrated solution was viscous and deep blue colored.

The concentrated precursor solution was spin coated onto the (100) surface of a single crystal $SrTiO_3$ substrate as described in Example III, except that the spin rates were 1000 RPM rather than 500 RPM, and 2000 RPM rather than 1000 RPM. The precursor film was then decomposed as described in Example I.

Figure 6:
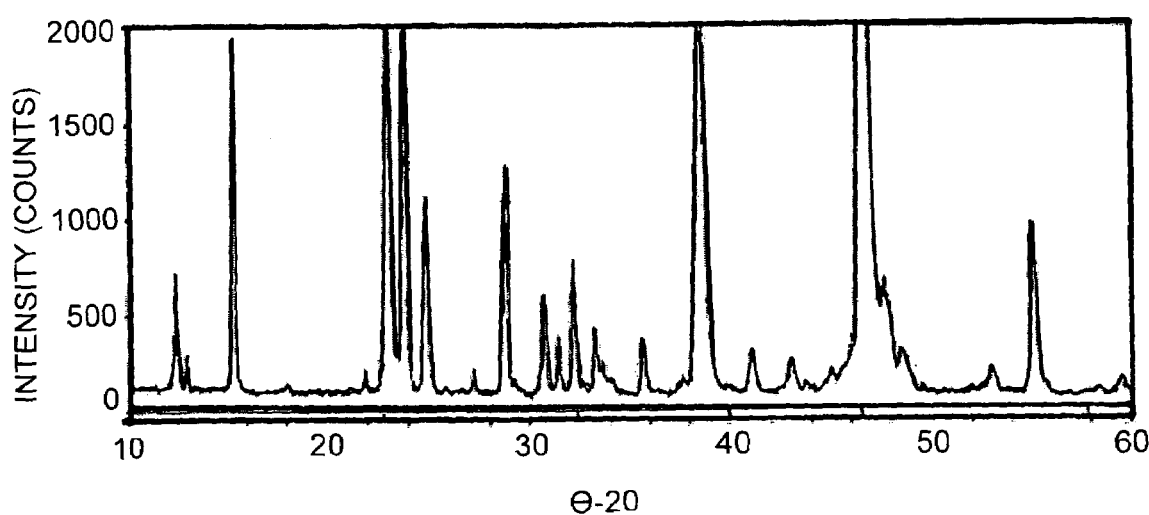
FIG. 6 is a θ-2θ X-ray diffraction scan of a film of $YBa_2Cu_3O_{7-x}$.

After decomposition of the precursor film, the intermediate film was about three to about four micrometers thick and had no visible defects. The intermediate film was further reacted as in Example I to form a $YBa_2Cu_3O_{7-x}$ film. FIG. 6 is a θ-2θ X-ray diffraction scan of the $YBa_2Cu_3O_{7-x}$ film, showing substantial formation of textured $YBa_2Cu_3O_{7-x}$ along with minor unidentified impurity phases.

EXAMPLE V

Example IV was repeated, except that spin rates of 500 RPM rather than 1000 RPM, and 1000 RPM rather than 2000 RPM were used. After decomposition of the precursor film, the intermediate film was greater than about four micrometers thick. The intermediate film was further reacted as in Example I to form a $YBa_2Cu_3O_{7-x}$ film.

EXAMPLE VI

Figure 7:
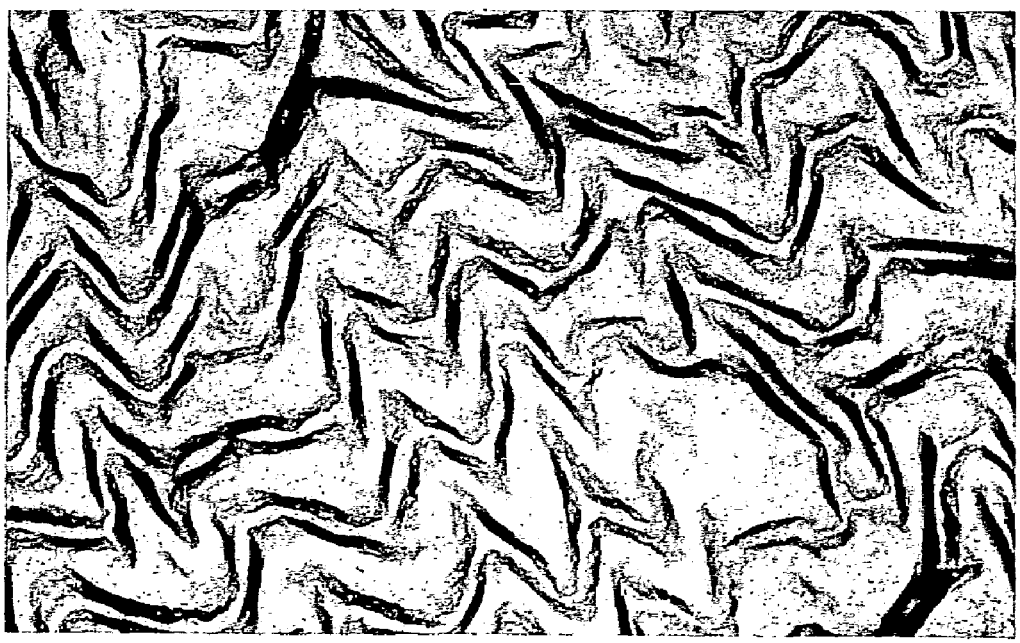
FIG. 7 is an optical micrograph of a film of an intermediate material.

A precursor solution prepared as in Example I was spin coated onto a $CeO_2$ capped YSZ single crystal substrate as described in Example I, but using spin rates of 1000 RPM rather than 2000 RPM, and 2000 RPM rather than 4000 RPM. The precursor film was decomposed by introducing the precursor to the furnace at 100° C. under a gas environment having a total pressure of about 760 Torr (about 29 Torr $H_2O$ and the balance $O_2$). The furnace was heated to about 400° C. at about 5° C. per minute, and held at 400° C. for about 30 minutes, then cooled to room temperature, forming a film of an intermediate material. FIG. 7 is an optical micrograph of the film of the intermediate material (750× magnification), showing that film contained many visible defects.

EXAMPLE VII

Figure 8:
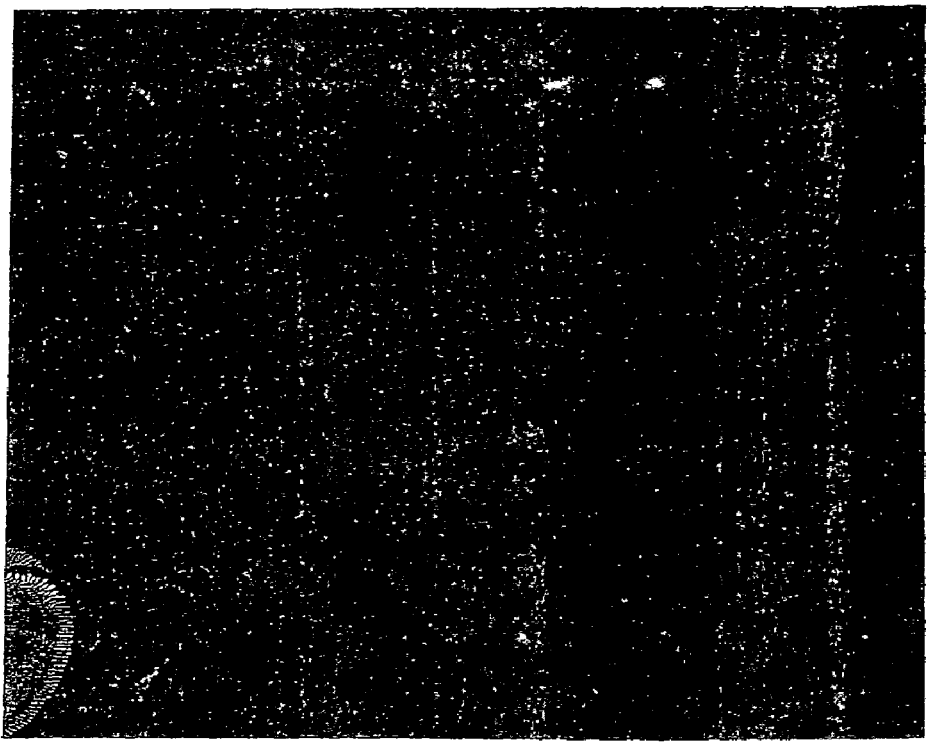
FIG. 8 is an optical micrograph of a film of an intermediate material.

A precursor solution prepared as in Example IV was spin coated onto a $CeO_2$ capped YSZ single crystal substrate as described in Example IV. The precursor film was decomposed by introducing the precursor to the furnace at 300° C.

under a gas environment having a total pressure of about 760 Torr (about 29 Torr $H_2O$ and the balance $O_2$). The furnace was heated to about 400° C. at about 5° C. per minute, and held at 400° C. for about 30 minutes, then cooled to room temperature, forming a film of an intermediate material. FIG. 8 is an optical micrograph of the film of the intermediate material (750× magnification), showing that the film contained no visible defects.

EXAMPLE VIII

Figure 9:
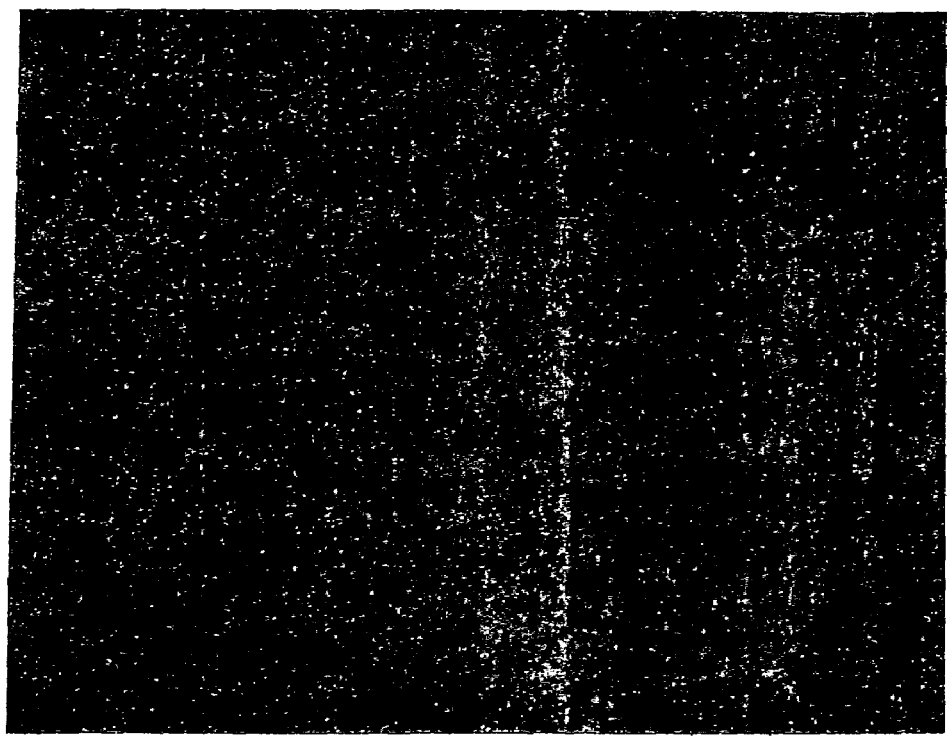
FIG. 9 is an optical micrograph of a film of an intermediate material.

A precursor solution prepared as in Example IV was spin coated onto a $CeO_2$ capped YSZ single crystal substrate as described in Example IV. The precursor film was decomposed by introducing the precursor to the furnace at 400° C. under the gas environment described in Example VI. The furnace was held at about 400° C. for about 30 minutes, then cooled to room temperature, forming a film of an intermediate material. FIG. 9 is an optical micrograph of the film of the intermediate material, showing that the film contained no visible defects.

EXAMPLE IX

A precursor solution was prepared as follows. About five grams of trichloroacetic acid $(CCl_3CO_2)H$ was dissolved in about five milliliters of methanol. About 1.974 grams of $Cu(O_2C-CH_3)_2 \cdot 2H_2O$, about 1.022 grams of $Ba(O_2C-CH_3)_2$ and about 0.6762 gra $Y(O_2C-CH_3)_3 \cdot 4H_2O$ were added sequentially to the trichloroacetate/methanol mixture. This mixture was then dried under vacuum, and three grams of the dried solid were dissolved in about five milliliters of methanol to form the precursor solution.

Figure 10:
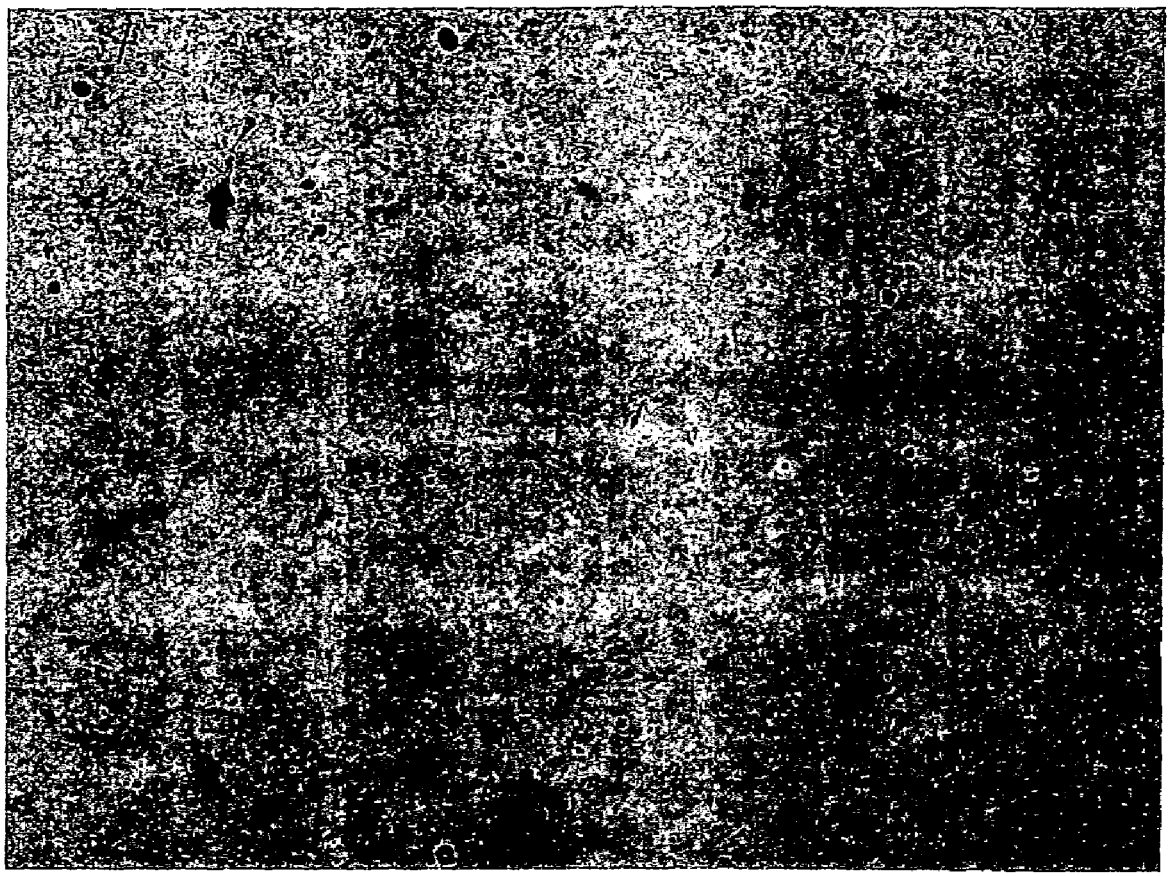
FIG. 10 is an optical micrograph of a film of an intermediate material

The precursor solution was spin coated onto a $CeO_2$ capped YSZ single crystal substrate as described in Example IV. The precursor film was then decomposed as described in Example I to form a film of an intermediate material. FIG. 10 is an optical micrograph of the film of the intermediate material (37× magnification), showing that the film contained no visible defects.

EXAMPLE X

A precursor solution was prepared as follows.

About 8.55 grams of $Y(CF_3CO_2)_3$ and about 14.5321 grams of $Ba(CF_3CO_2)_2$ were dissolved in about 50 milliliters of methanol to form one solution.

Another solution was formed as follows. About 11.98 grams of $Cu(CH_3CO_2)_2 \cdot H_2O$ was dispersed in about 10 milliliters of methanol and heated under reflux for about 10 minutes. About 20 milliliters of $C_2H_5COOH$ was then added drop wise and boiled under reflux for about 30 minutes, followed by cooling to about room temperature.

The above two solutions were mixed together under stirring for about 10 minutes and then concentrated to about 50 milliliters by removal of solvent under vacuum.

The resulting, concentrated solution was spin coated onto a $CeO_2$ capped YSZ single crystal substrate using the spin coating parameters described in Example I.

The coated sample was decomposed as follows. The sample was introduced into the furnace by introducing to the furnace described in Example I at about 200° C. under in a nominal gas environment having a total pressure of about 760 torr (about 17 torr $H_2O$ and balance $O_2$). The furnace was then heated to about 250° C. at rate of about 1° C. per minute. The sample was further heated to about 400° C. at a rate of about 10° C. per minute (in the same nominal gas environment), and then cooled to room temperature (in the same nominal gas environment) to form a film of an intermediate material.

Figure 11:
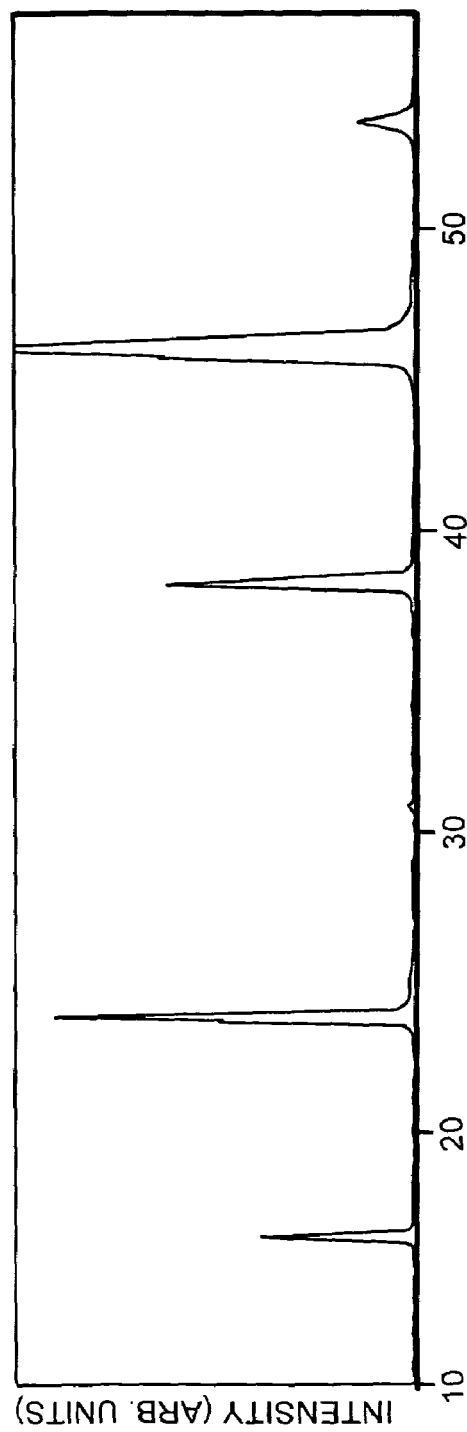
FIG. 11 is a θ-2θ X-ray diffraction scan of a film of $YBa_2Cu_3O_{7-x}$.

After decomposition, the intermediate film was further reacted as described in Example I to form a $YBa_2Cu_3O_{7-x}$ layer. FIG. 11 is the θ-2θ X-ray diffraction scan of the $YBa_2Cu_3O_{7-x}$ layer, showing formation of high quality (001) textured $YBa_2Cu_3O_{7-x}$ layer which is about 0.41 micrometer thick. The $YBa_2Cu_3O_{7-x}$ layer had a critical current density of about $4.2 \times 10^6$ Amperes per square centimeter at 77 K (self field).

EXAMPLE XI

A concentrated precursor solution was prepared as described in Example X. The concentrated precursor solution was spin coated onto a $CeO_2$ capped YSZ single crystal substrate using the spin coating parameters described in Example I except that the spin rates were 1500 RPM rather than 2000 RPM, and 3000 RPM rather than 4000 RPM. The spin coated film was decomposed as described in Example X, and the intermediate film was further reacted as described in Example 1. The resulting layer was (001) textured $YBa_2Cu_3O_{7-x}$ and about 0.5 micrometer thick. The $YBa_2Cu_3O_{7-x}$ layer had a critical current density of about $3.2 \times 10^6$ Amperes per square centimeter 77 K (self field).

EXAMPLE XII

A precursor solution was prepared as follows.

A first solution was formed by dispersing about 1.35 grams of $Y(CH_3CO_2)_3 \cdot 4H_2O$ in about 10 milliliters of methanol. About five milliliters of $C_2H_5COOH$ and about three milliliters of $NH_4OH$ were added under stirring until the solution became clear.

A second solution was formed by dissolving about 2.9 grams of $Ba(CF_3CO_2)_2$ in about 10 milliliters of $CH_3OH$.

A third solution was formed by dispersing about 2.4 grams of $Cu(CH_3CO_2)_2 \cdot H_2O$ in about 10 ml of methanol. About five milliliters of $C_2H_5COOH$ and about three milliliters of NH4OH were added drop wise until the solution became clear.

The above three solutions of were mixed together under stirring for about 10 minutes and then concentrated to about 10 milliliters by removal of solvent under vacuum.

Figure 12:
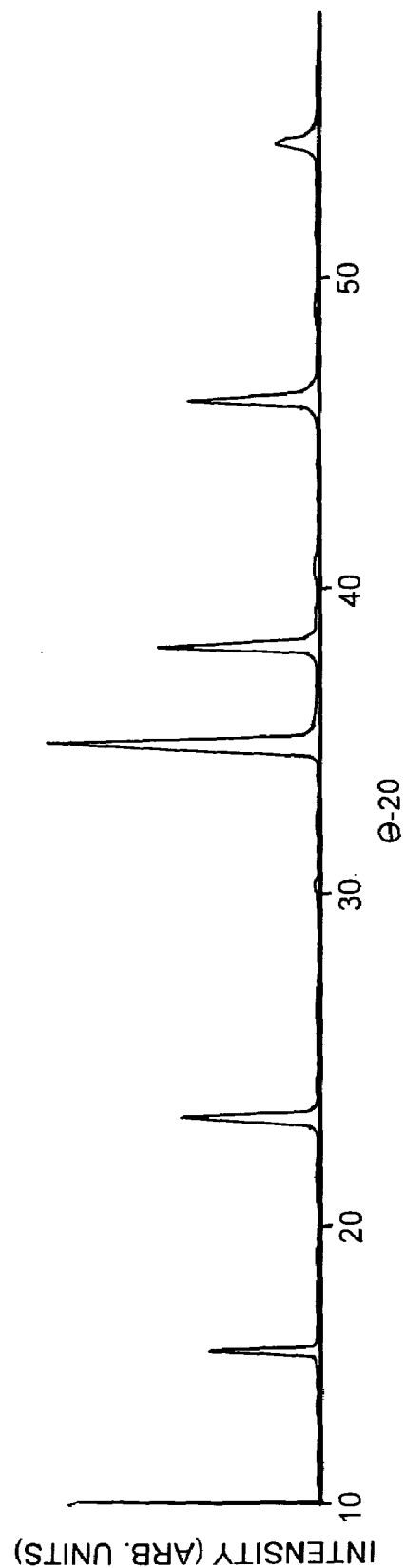
FIG. 12 is a θ-2θ X-ray diffraction scan of a film of $YBa_2Cu_3O_{7-x}$.

The resulting concentrated solution was spin coated onto a $CeO_2$ capped YSZ single crystal substrate using the spin coating parameters described in Example I. The coated film was decomposed as described in Example X. After decomposition, the intermediate film was further reacted as described in Example I to form a $YBa_2Cu_3O_{7-x}$ layer. FIG. 12 is the θ-2θ X-ray diffraction scan of the $YBa_2Cu_3O_{7-x}$ layer. The $YBa_2Cu_3O_{7-x}$ layer had a high quality (001) texture and was about 0.3 micrometer thick. The $YBa_2Cu_3O_{7-x}$ layer had a critical current density of about $4.8 \times 10^6$ Amperes per square centimeter at 77 K (self field).

EXAMPLE XIII

A precursor solution was prepared as follows. About 8.55 grams of $Y(CF_3CO_2)_3$, about 14.53 grams of $Ba(CF_3CO_2)_2$ and about 12.87 grams of $Cu(C_2H_5CO_2)_2$ were dissolved in about 60 milliliters of methanol. The solution was then concentrated to about 50 milliliters by removal of solvent under vacuum.

Figure 13:
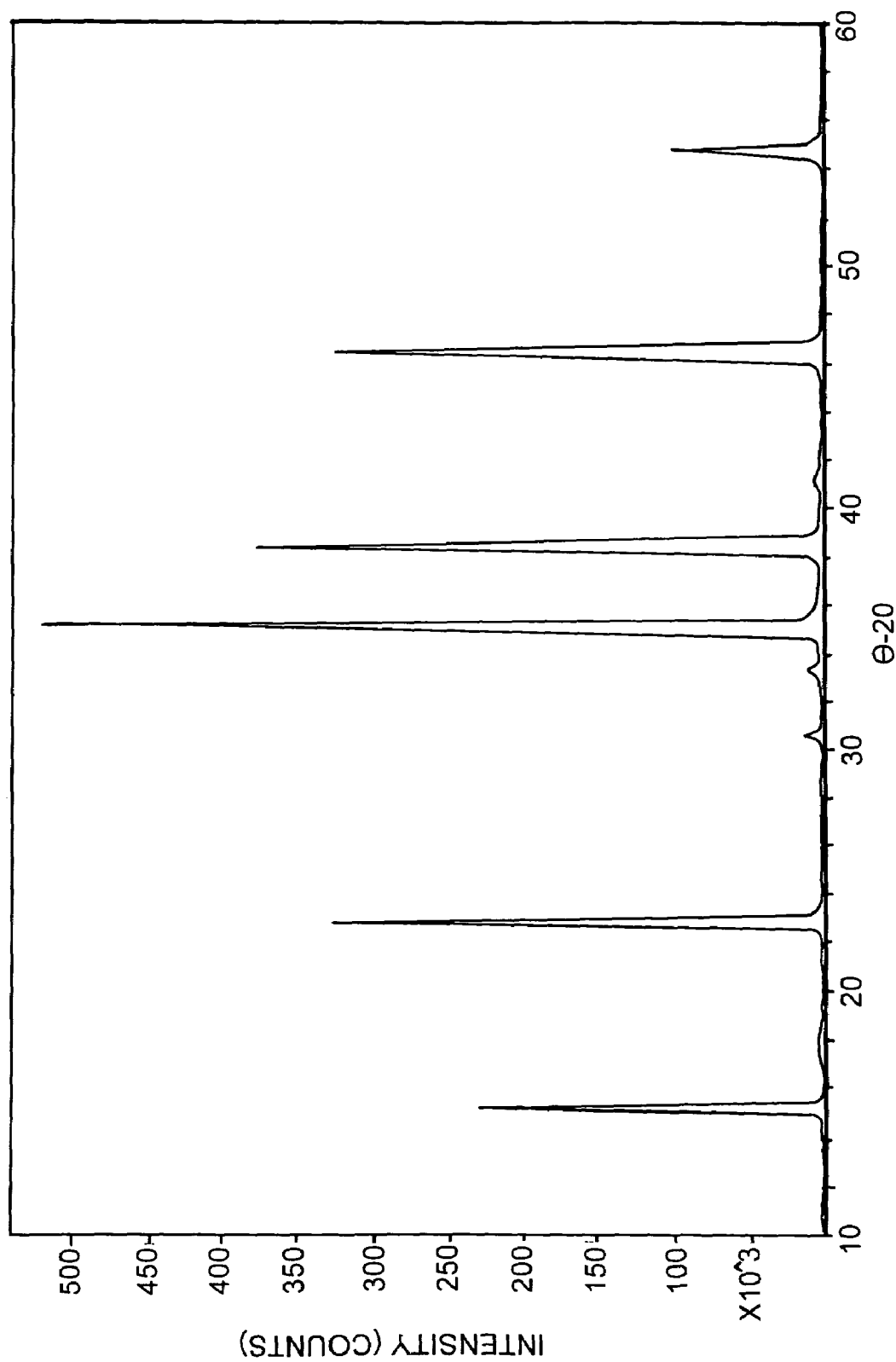
FIG. 13 is a θ-2θ X-ray diffraction scan of a film of $YBa_2Cu_3O_{7-x}$.

The concentrated precursor solution was spin coated onto a $CeO_2$ capped YSZ single crystal substrate using the spin coating parameters described in Example I. The coated film was decomposed as described in Example X. After decomposition, the intermediate film was further reacted as described in Example I to form a YBa$_2$Cu$_3$O$_{7-x}$ layer. FIG. 13 is the θ-2θ X-ray diffraction scan of the YBa$_2$Cu$_3$O$_{7-x}$ layer. The YBa$_2$Cu$_3$O$_{7-x}$ layer had a high quality (001) texture and was about 0.8 micrometer thick. The YBa$_2$Cu$_3$O$_{7-x}$ layer had a critical current density of about 3.8×10$^6$ Amperes per square centimeter at 77 K (self field) and a critical current of about 300 Amperes per centimeter width.

EXAMPLE XIV

A precursor solution was prepared as described in Example XIII. The precursor solution was deposited onto a continuous length of a metal tape substrate using a slot die coater.

The metal tape substrate was formed of four layers. The first layer was deformation textured nickel having a thickness of about 50 micrometers and a thickness of about 10 millimeters. An about 50 nanometer thick epitaxial layer of Gd$_2$O$_3$ was disposed on the textured surface of the nickel. An about 250 nanometer thick epitaxial layer of YSZ was disposed on the Gd$_2$O$_3$ layer. An about 24 nanometer thick epitaxial layer of CeO$_2$ layer was disposed on the YSZ layer.

The precursor film was deposited in an atmosphere containing about 11 torr H$_2$O and the balance nitrogen (total pressure of about 760 torr).

The precursor coated film was decomposed by transporting the coated tape through a tube furnace having a diameter of about 2.5 inches. The tube furnace had temperature and gas environment gradients. The sample was passed through the tube furnace at a transport rate so that the processing of the sample (i.e., temperatures and gas environments to which the sample was exposed during processing) was substantially the same as described in Example X.

The resulting YBa$_2$Cu$_3$O$_{7-x}$ film was about 0.8 micrometers thick and had no visible defects.

While certain embodiments have been described herein, the invention is not limited to these embodiments. Other embodiments are in the claims.

What is claimed is:

1. A method, comprising:
   disposing a precursor solution onto a surface of a layer to form a precursor film, the precursor film including a carboxylate salt of a rare earth metal, a fluorinated carboxylate salt of an alkaline earth metal and a nonhalogenated carboxylate salt of a transition metal; and
   treating the precursor film to form an intermediate of a rare earth metal-alkaline earth metal-transition metal oxide,
   wherein defects contained within the intermediate comprise less than about 20 percent of any volume element of the intermediate defined by a projection of one square centimeter of a surface of the intermediate.

2. The method of claim 1, wherein the precursor film is treated for less than about five hours.

3. The method of claim 1, wherein the intermediate has a thickness of at least about one micrometer.

4. The method of claim 1, further comprising treating the intermediate to form a layer of a rare earth metal-alkaline earth metal-transition metal oxide having a critical current density of at least about 0.5×10$^6$ Amperes per square centimeter.

5. The method of claim 1, wherein the carboxylate salt of the transition metal comprises Cu(O$_2$CC$_2$H$_5$)$_2$.

6. The method of claim 5, wherein the alkaline earth metal salt comprises barium trifluoroacetate.

7. The method of claim 6, wherein the rare earth metal salt comprises a salt selected from the group consisting of halogenated yttrium carboxylates and nonhalogenated yttrium carboxylates.

8. The method of claim 1, wherein the alkaline earth metal salt comprises barium trifluoroacetate.

9. The method of claim 8, wherein the rare earth metal salt comprises a salt selected from the group consisting of halogenated yttrium acetates and nonhalogenated yttrium acetates.

10. The method of claim 1, wherein the intermediate has a surface adjacent the surface of the layer and the intermediate has a plurality of volume elements, and wherein defects contained within the intermediate comprise less than about 20 percent of any volume element of the intermediate defined by a projection of one square centimeter of the surface of the intermediate, and the intermediate is free of any defect having a maximum dimension greater than about 200 micrometers.

11. The method of claim 1, wherein the intermediate of the rare earth metal-alkaline earth metal-transition metal oxide is further treated to form a superconductor material having a critical current of at least about 200 Amperes per centimeter width.

12. The method of claim 1, wherein the carboxylate salt of the transition metal comprises a propionate salt of the transition metal.

13. A method, comprising:
   disposing a precursor solution onto a surface of a layer to form a precursor film, the precursor film including a carboxylate salt of a rare earth metal, a fluorinated carboxylate salt of an alkaline earth metal and a nonhalogenated carboxylate salt of copper; and
   treating the precursor film to form an intermediate of a rare earth metal-alkaline earth metal-transition metal oxide,
   wherein defects contained within the intermediate comprise less than about 20 percent of any volume element of the intermediate defined by a projection of one square centimeter of a surface of the intermediate.

14. The method of claim 13, wherein the precursor film is treated for less than about five hours.

15. The method of claim 13, wherein the precursor solution further comprises a Lewis base.

16. The method of claim 15, wherein the Lewis base comprises a nitrogen-containing compound.

17. The method of claim 16, wherein the nitrogen-containing compound is selected from the group consisting of ammonia and amines.

18. The method of claim 13, wherein the intermediate has a thickness of at least about two micrometers.

19. The method of claim 13, wherein the intermediate has a thickness of at least about three micrometers.

20. The method of claim 13, wherein the intermediate has a thickness of at least about four micrometers.

21. The method of claim 13, wherein the intermediate has a thickness of at least about five micrometers.

22. The method of claim 13, further comprising treating the intermediate to form a layer of a rare earth metal-alkaline earth metal-transition metal oxide material having a critical current density of at least about 0.5×10$^6$ Amperes per square centimeter.

23. The method of claim 13, wherein the rare earth metal salt comprises a salt selected from the group consisting of halogenated yttrium acetates and nonhalogenated yttrium acetates.

24. The method of claim 13, wherein the alkaline earth metal salt comprises barium trifluoroacetate.

25. The method of claim 24, wherein the rare earth metal salt comprises a salt selected from the group consisting of halogenated yttrium acetates and nonhalogenated yttrium acetates.

26. The method of claim 13, wherein the intermediate has a surface adjacent the surface of the layer and the intermediate has a plurality of volume elements, and wherein defects contained within the intermediate comprise less than about 20 percent of any volume element of the intermediate defined by a projection of one square centimeter of the surface of the intermediate, and the intermediate is free of any defect having a maximum dimension greater than about 200 micrometers.

27. The method of claim 26, wherein the intermediate is capable of being processed to form a superconductor material having a critical current density of at least about $0.5 \times 10^6$ Amperes per square centimeter.

28. The method of claim 13, wherein the intermediate of the rare earth metal-alkaline earth metal-transition metal oxide is further treated to form a superconductor material having a critical current of at least about 200 Amperes per centimeter width.

29. The method of claim 13, wherein the carboxylate salt of the copper comprises a propionate salt of the copper.

30. A method, comprising:
disposing a precursor solution onto a surface of a layer to form a precursor film, the precursor film including a carboxylate salt of a rare earth metal, a fluorinated carboxylate salt of an alkaline earth metal, a nonhalogenated carboxylate salt of a transition metal, and a Lewis base; and
treating the precursor film to form an intermediate of a rare earth metal-alkaline earth metal-transition metal oxide,
wherein defects contained within the intermediate comprise less than about 20 percent of any volume element of the intermediate defined by a projection of one square centimeter of a surface of the intermediate.

31. The method of claim 30, wherein the Lewis base comprises a nitrogen-containing compound.

32. The method of claim 31, wherein the nitrogen-containing compound is selected from the group consisting of ammonia and amines.

33. The method of claim 31, wherein the nitrogen-containing compound is selected from the group consisting of $CH_3CN$, $C_5H_5N$ and $R_1R_2R_3N$, wherein each of $R_1$ $R_2$ and $R_3$ are independently selected from the group consisting of H, a straight chained alkyl group, a branched alkyl group, an aliphatic alkyl group, a non-aliphatic alkyl group and a substituted alkyl group.

34. The method of claim 30, wherein the intermediate has a surface adjacent the surface of the layer and the intermediate has a plurality of volume elements, and wherein defects contained within the intermediate comprise less than about 20 percent of any volume element of the intermediate defined by a projection of one square centimeter of the surface of the intermediate, and the intermediate is free of any defect having a maximum dimension greater than about 200 micrometers.

35. The method of claim 30, wherein the precursor film is treated for less than about five hours.

36. The method of claim 30, wherein the intermediate has a surface adjacent the surface of the layer and the intermediate has a plurality of volume elements, and wherein defects contained within the intermediate comprise less than about 10 percent of any volume element of the intermediate defined by a projection of one square centimeter of the surface of the intermediate, and the intermediate is free of any defect having a maximum dimension greater than about 200 micrometers.

37. The method of claim 30, wherein the intermediate is capable of being processed to provide a superconductor material having a critical current density of at least about $0.5 \times 10^6$ Amperes per square centimeter.

38. The method of claim 30, wherein the intermediate of the rare earth metal-alkaline earth metal-transition metal oxide is further treated to form a superconductor material having a critical current of at least about 200 Amperes per centimeter width.

39. The method of claim 30, wherein the salt of the transition metal comprises a carboxylate salt of the transition metal.

40. A method, comprising:
disposing a precursor solution onto a surface of a layer to form a precursor film, the precursor film including a carboxylate salt of a rare earth metal, a fluorinated carboxylate salt of an alkaline earth metal, a nonhalogenated carboxylate salt of a transition metal; and
treating the precursor film to form a superconductor material having a critical current of at least about 200 Amperes per centimeter of width,
wherein defects contained within the superconductor material comprise less than about 20 percent of any volume element of the superconductor material defined by a projection of one square centimeter of a surface of the superconductor material.

41. The method of claim 40, wherein the superconductor material has a critical current of at least about 300 Amperes per centimeter of width.

42. The method of claim 40, wherein the superconductor material has a critical current of at least about 500 Amperes per centimeter of width.

43. The method of claim 40, wherein the precursor solution comprises a salt of a rare earth metal, a salt of an alkaline earth metal and a salt of a transition metal.

44. The method of claim 43, wherein the rare earth metal is yttrium, the alkaline earth metal is barium, and the transition metal is copper.

45. The method of claim 40, wherein the superconductor material comprises a rare earth metal-alkaline earth metal-transition metal oxide.

46. The method of claim 40, wherein the superconductor material comprises YBCO.

47. The method claim 40, wherein the method includes forming an intermediate of the superconductor material.

48. The method of claim 47, wherein the intermediate is metal oxyfluoride intermediate.

* * * * *